United States Patent [19]

Sillner

[11] Patent Number: 4,628,585
[45] Date of Patent: Dec. 16, 1986

[54] APPARATUS FOR THE AUTOMATIC HANDLING OF ELECTRICAL COMPONENTS

[76] Inventor: Georg Sillner, Buchenstrasse 23, 8411 Zeitlarn, Fed. Rep. of Germany

[21] Appl. No.: 701,678

[22] Filed: Feb. 14, 1985

[30] Foreign Application Priority Data

Feb. 18, 1984 [DE] Fed. Rep. of Germany ....... 3405971
Feb. 28, 1984 [DE] Fed. Rep. of Germany ....... 3407234

[51] Int. Cl.⁴ .............................................. H05K 3/30
[52] U.S. Cl. ..................................... 29/564.6; 29/741
[58] Field of Search ............... 29/33 M, 564, 564.1, 29/564.6, 564.8, 739, 741

[56] References Cited

U.S. PATENT DOCUMENTS

| | | | |
|---|---|---|---|
| 3,597,824 | 8/1971 | Yoshida et al. | 29/564.6 |
| 4,051,593 | 10/1977 | Mori et al. | 20/564.6 |
| 4,054,988 | 10/1977 | Masuzima et al. | 29/564.6 |
| 4,263,708 | 4/1981 | Takahashi et al. | 29/564.6 |
| 4,293,999 | 10/1981 | Woodman, Jr. | 29/564.6 |
| 4,312,109 | 1/1982 | Kawana et al. | 29/564.6 |
| 4,344,219 | 8/1982 | Tanabe et al. | 29/564.6 |
| 4,398,658 | 8/1983 | Snyder et al. | 29/739 |

Primary Examiner—Gil Weidenfeld
Assistant Examiner—Daniel W. Howell
Attorney, Agent, or Firm—Shapiro and Shapiro

[57] ABSTRACT

The apparatus for the automatic handling of electrical components comprises a first device for sequence formation, in which the components are available in a radially bound form in magazines on a plurality of belts with perforation holes, each belt supporting components of one type. The components are called up from the magazines to loading positions in a program-controlled manner and are conveyed with the aid of a conveyor element to a transfer station in a sequence necessary for the equipment of an electrical circuit. At the transfer station the components are conveyed to a second device for further handling. This second device is either a binding station or, preferably, an insertion head for the equipment of an electrical circuit.

19 Claims, 33 Drawing Figures

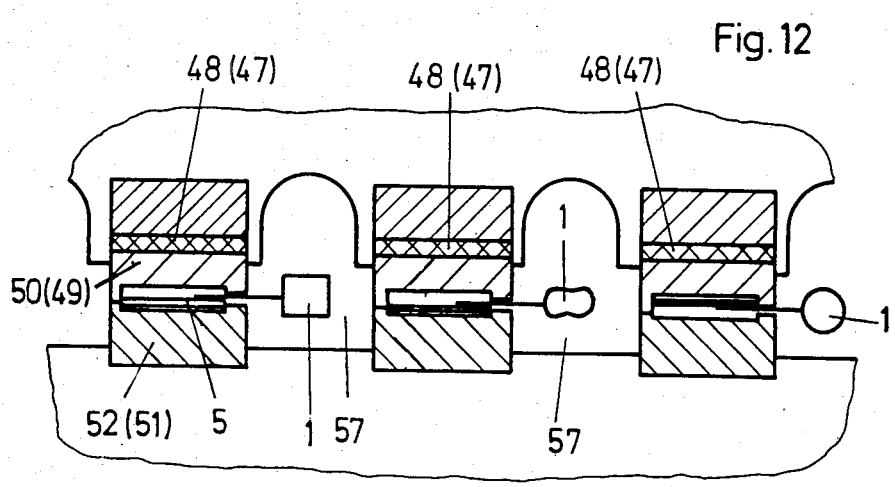
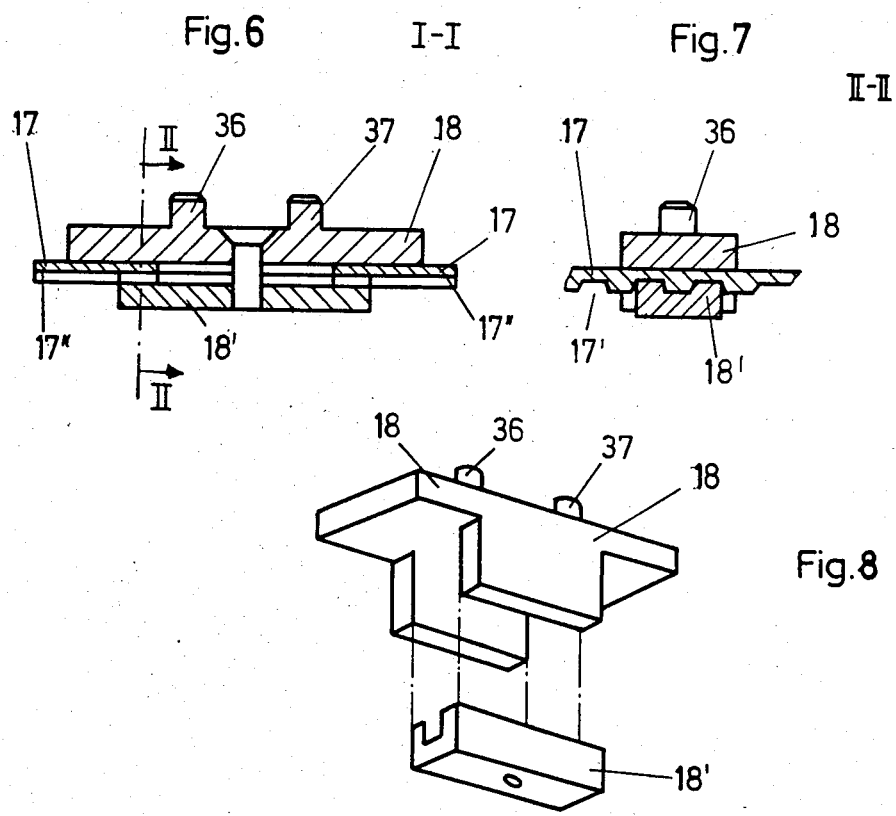

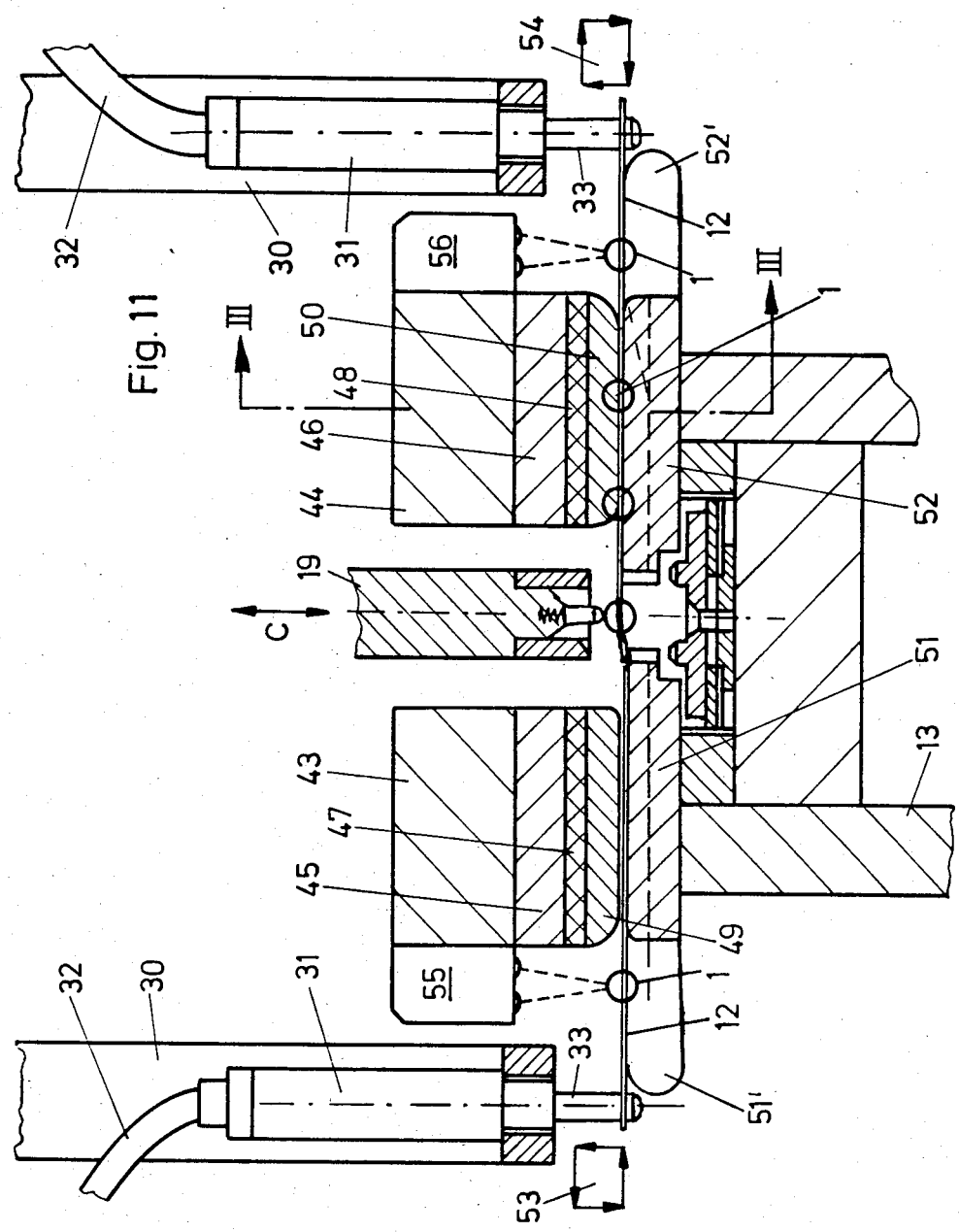

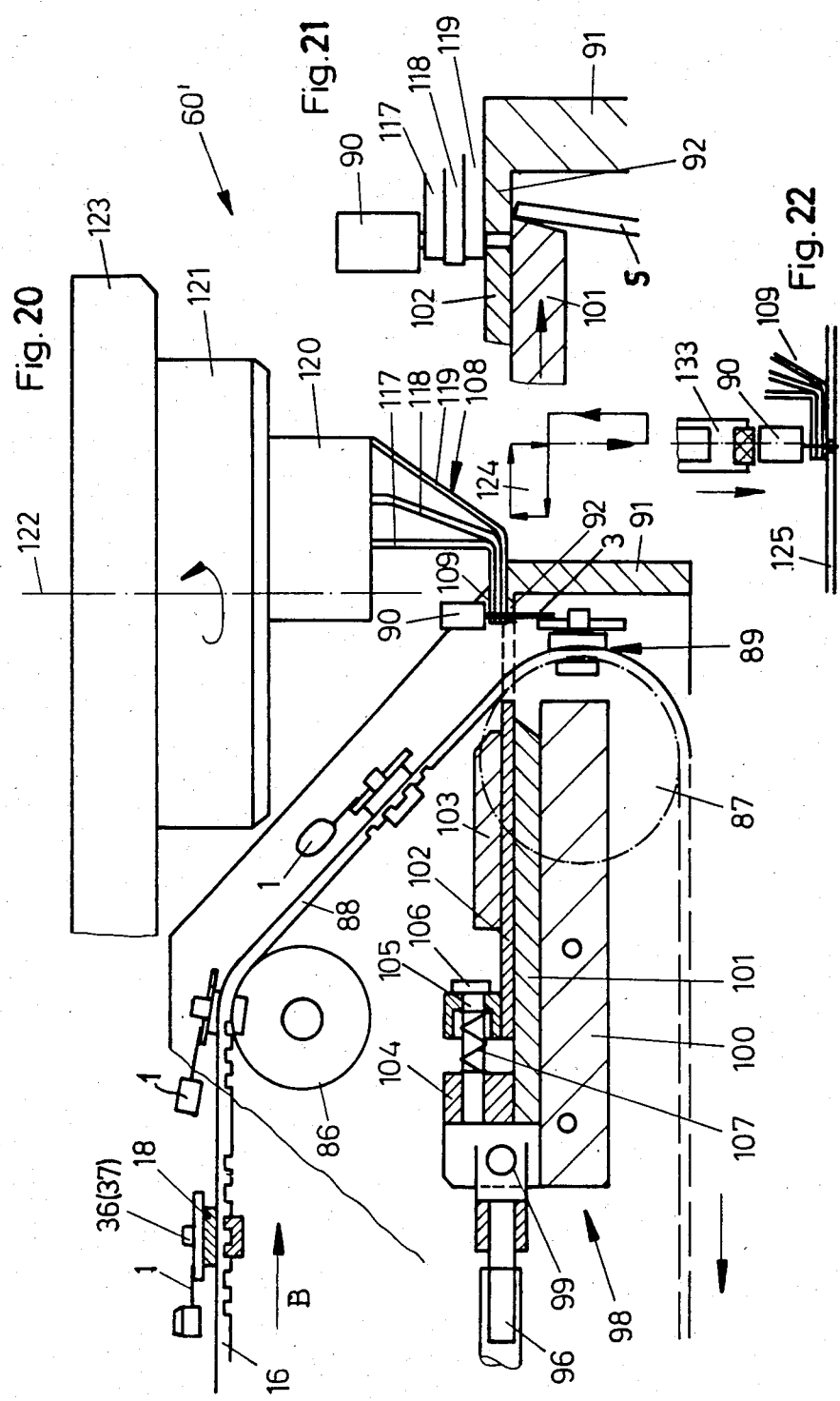

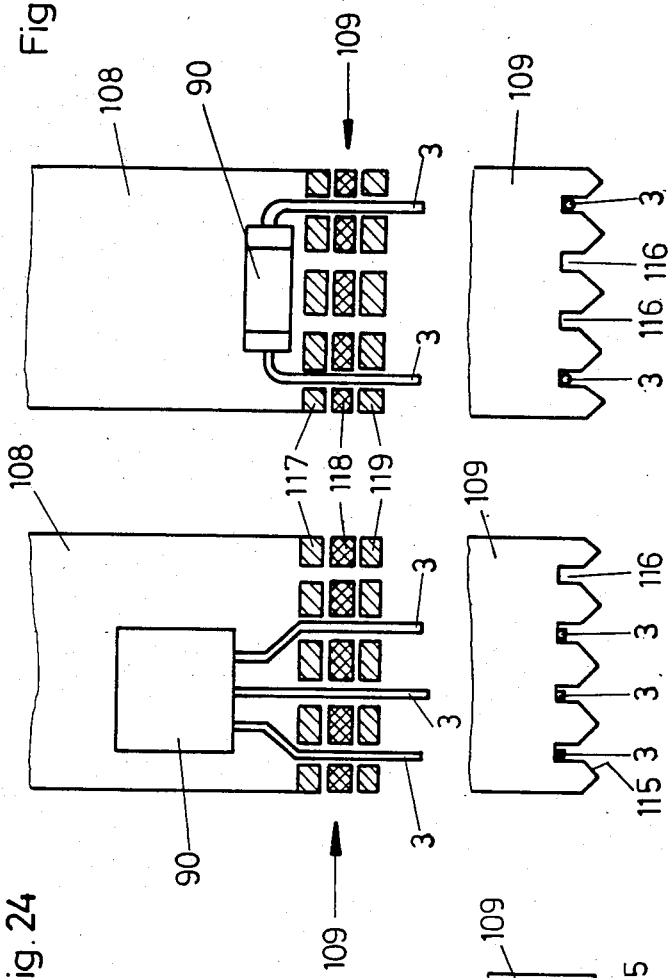

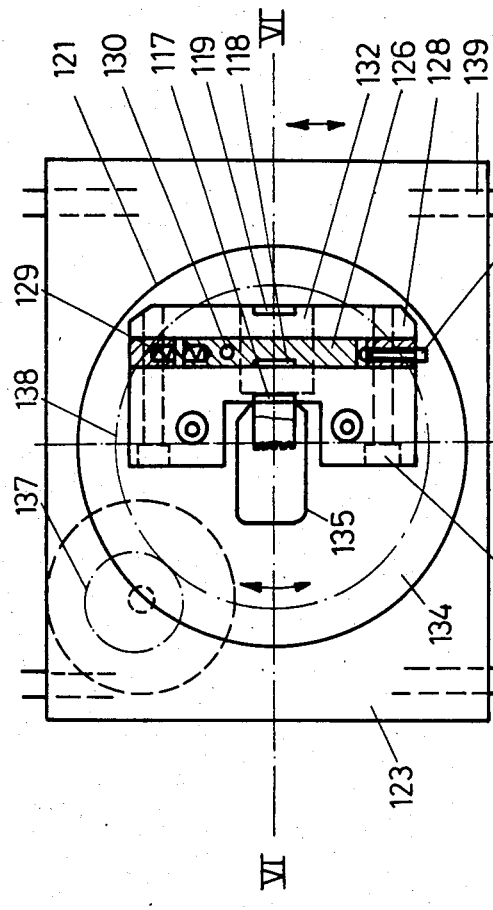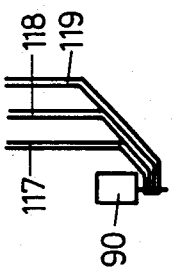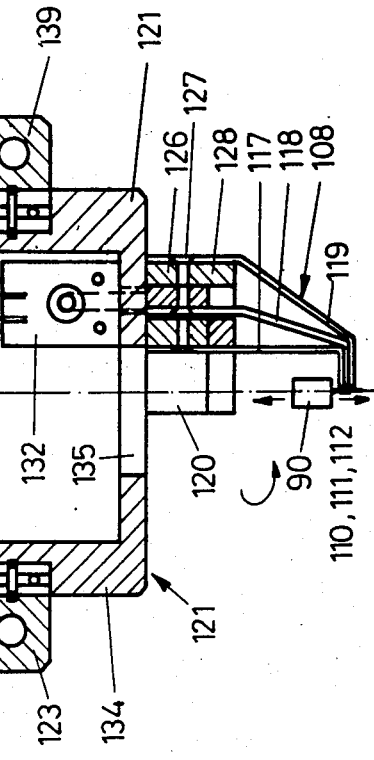

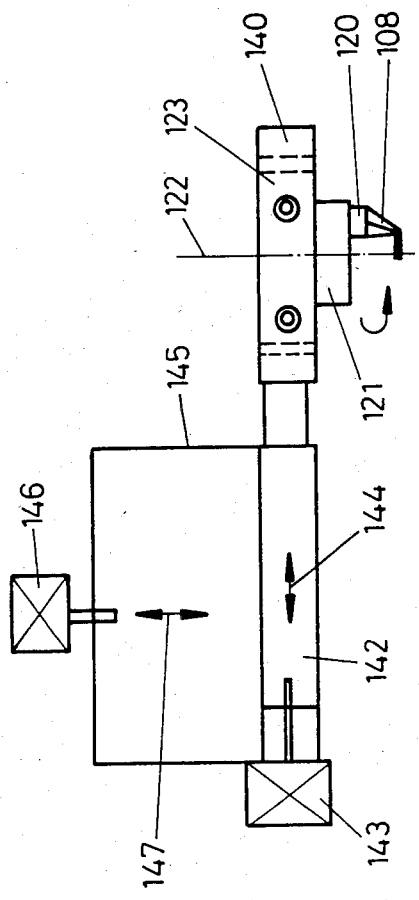
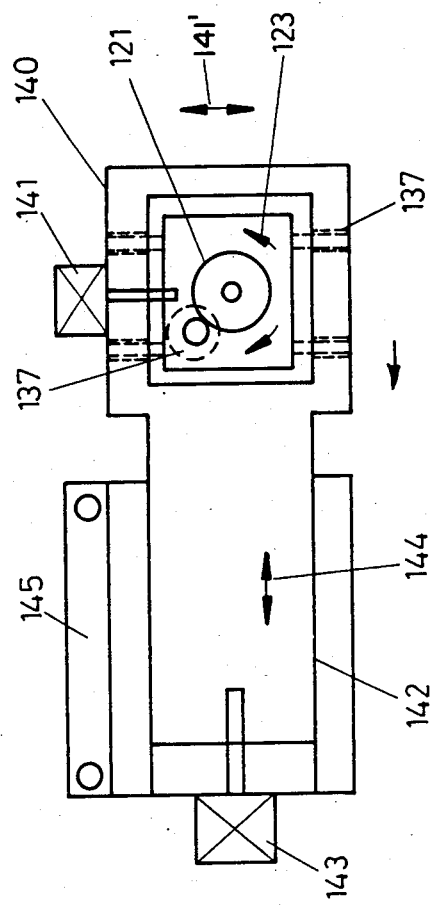
Fig. 30
Fig. 29

APPARATUS FOR THE AUTOMATIC HANDLING OF ELECTRICAL COMPONENTS

The invention relates to an apparatus for the automatic handling of electrical components, which in each case are available in boxes in a magazine arrangement formed by a plurality of magazines in a radially bound form on rollers (coils) formed by belts or on belts folded in a zigzag shape, each belt having components of the same type in each case and different belts having different components. The components are called up in a program-controlled manner from the magazines in a first device and transferred to a conveyor element on which components of different type are then arranged in a sequence necessary for subsequent insertion in an electrical circuit (e.g. a printed circuit board). The components are conveyed by the conveyor element in the pre-determined sequence to a transfer station and from there to a second device which is either a binding station for renewed binding of the components on a common belt in the pre-determined sequence or an insertion head by which the components are inserted into an electrical circuit (printed circuit board) in the pre-determined sequence.

Apparatus for the renewed binding of electrical components in a pre-determined sequence are known. The belt produced with these devices is used in automatic insertion apparatus for electrical circuits which do not comprise any devices for sequence formation, such an apparatus preferably being used for renewed binding together with a plurality of automatic insertion apparatus which can then have a relatively simple design.

These known apparatus for renewed binding have the disadvantage that they have a complicated structure in particular with respect to the design of the conveyor element and its holders for the components and relatively substantial masses must be moved which permit only a relatively low output and render difficult the precise positioning of the holders of the conveyor element generally driven in timed sequence.

In addition, automatic apparatus with a device for sequence formation for radially bound components are known. They may basically be classified in two groups.

In the case of known machines (TDK/UNIVERSAL) of a first group the components are held directly on their terminal wires during the sequence formation and conveying from the magazines to the insertion head. This type of holding is very delicate, and is particularly susceptible to interference (for example bending of the terminal wires). Since the terminal wires of components of different types can vary widely in cross-section, there are considerable difficulties. In addition, in these known machines it is not possible to work to a universal grid size. A quite crucial disadvantage is also that the sequence of components, once established, can no longer be rectified in the event of defective insertion for example and must therefore be subsequently corrected manually. A rectifying program is not possible.

In the case of known machines (PANASERT/FUJI) it is necessary for the entire component stock, i.e. the magazines with the components held on the belts, associated cutting apparatus and devices for advancing the componets from the magazines to be moved in such a way that the magazine corresponding to the component required in each case is moved up to the insertion device or insertion head and is moved away again after the removal of the component. The disadvantage of these known machines is the fact that substantial masses must be moved during the insertion of an electrical circuit, as a result of which the rate of insertion is relatively low. In addition, it is not possible to change the magazine stock while running. The machine must frequently be stopped for changing purposes. Common to all the systems mentioned above is the disadvantage that it is not possible or is possible only with considerable expense to insert three or multiple-armed radially bound components, since the central wire or wires cannot be precisely held by the insertion pincers for definite insertion into the printed circuit board. In addition, it is not possible to handle components with different grid sizes, i.e. intervals of the terminal wires, without changing the pincer systems. For the FUJI system for example each grid size must have its own insertion head. A very expensive insertion head changing device must therefore be provided in accordance with the revolver principle. Furthermore, all the systems mentioned above have the common disadvantage that extremely complicated cutting and bending tools are required below the printed circuit board for cutting and bending the projecting stumps of wire. In this connection, removing these stumps of wire in a very small space is very difficult, since in this position the cutting apparatus must have associated with it a measuring apparatus which once more checks the presence of the terminal wires. In general all the known automatic insertion apparatus mentioned above have the disadvantage that they are of relatively large dimensions, a large space requirement and a substantial weight and are relatively complicated in design. In addition, it is not possible in any system to check all the components before insertion completely both electrically and mechanically.

The object of the present invention is to provide apparatus which will permit, with little outlay in terms of procedure and structure, radially bound components to be conveyed in a likewise radial form and in the sequence necessary for insertion in an electrical circuit to a transfer station and from there to a device for the further use of the components, the latter being either a binding station or preferably the insertion head, so that the apparatus then represents an automatic insertion apparatus with a device for sequence formation.

It is further the object of the invention to provide a universal, simple and inexpensive apparatus which is not susceptible to poor component quality and which in particular also avoids a multiple transfer of components to the conveyor element and also to the second device for further use, in order to increase operational reliability: which allows the belt to be changed on the magazines without interrupting the operation of the apparatus; which can handle one, two, three, four or more terminal wires in the same way without any resetting; which when constructed as an automatic insertion apparatus renders cutting the projecting length of the terminal wire under the printer circuit board superfluous; which permits a forward and reverse movement of the conveyor element (sequence belt) for repair purposes; which when constructed as an automatic insertion apparatus moves the components on the conveyor element into a vertical position without further transfer and transfers them directly to insertion pincers of the insertion head which then centres all the terminal wires of each component and clamps them individually; and which above all also makes it possible for all components to be tested, when already on the conveyor element during operation, for their presence, for their electrical functioning, mechanical accuracy to size and standardization.

In order to attain this object, an apparatus is designed according to the characterizing part of claim 1. Further embodiments of the invention form the subjects of the Sub-Claims.

In the case of the apparatus according to the invention the conveyor element is preferably a self-contained endless belt- or band-shaped element which is preferably constructed in the form of a toothed belt. The belt comprises two endless individual elements which are arranged parallel to one another and at a distance from one another and which are joined to one another by two webs which lie transversely to the conveying direction of the conveyor element. The webs form the holders for the components. The components are held on belt portions which are produced by cutting off the component supply belts and which are centred and clamped in the region of their hole areas on lugs or pins on the holders.

If the apparatus according to the invention is constructed as an automatic insertion apparatus with an insertion head arranged downstream of the conveyor element, the conveyor element is guided at the transfer station preferably about a deflector roller. On reaching the deflector roller the components are pivoted on the conveyor element with their heads opposite the following part of the conveyor element and are preferably moved into a vertical position in which the components can then easily be gripped by insertion pincers of the insertion head. The insertion head or its insertion pincers are pivotable about 360° and, in addition, are also controlled and constructed in such a way that the insertion pincers permit the absolutely minimum lateral distance from the adjacent components on a printed circuit board and in this way permit the maximum insertion or packing density.

In the case of the apparatus according to the invention all the components can be bound at a uniform binding height in the belts used for delivery, and even components with different cross-sections and in particular different diameters can be handled with a very high degree of operational reliability.

This object is attained according to the invention with the features of the characterizing part of claim 1. Further embodiments of the invention form the subjects of the Sub-Claims.

The design and mode of operation of the apparatus according to the invention are as follows:

By virtue of the invention a method of automatically handling electrical components is possible. More particularly, in a first device for sequence formation, the components are available in magazines on a plurality of belts in a radially bound form with each belt supporting components of one type. The components are called up from the magazines in a program-controlled manner to loading positions and are conveyed in a sequence necessary for insertion in an electrical circuit with the aid of a conveyor element to a transfer station at which the components are transferred to a second device for further handling. For and for the transfer of each component to the conveyor element, which is circulating in a timed manner, the respective belt is cut in the region between this component and a following component. The belt is cut at the centre of a perforation transversely to the direction of movement of the belt (longitudinal direction of the belt) and the belt portion thus produced which supports the first-mentioned component is transferred to the conveyor element in such a way that the belt portion is centred and securely held on its hole areas on the conveyor element. The conveying direction of the cut off components on the conveyor element is in the axial direction of the terminal wires of the said components in the plane of the belt and transverse to the direction of movement of the belt.

The method with the apparatus according to the invention is preferably arranged in such a way that if the components are rebound or newly bound in a sequence required for insertion into a circuit the belt portions with the components are transferred in succession at the transfer station to a further conveyor element, at which the belt portions are centred and held in a direct sequence one above the other on their hole areas and are bound together to form a common belt.

On the other hand, for the purpose of insertion in a printed circuit board provided with holes the components at the transfer position are moved into a vertical position, are centred and clamped on the terminal wires at this position and the terminal wires are orientated. In the clamped state of each component an insertion apparatus is introduced between the terminal wires of the component and all the terminal wires of the component are securely held. The centred and clamped terminal wires below the insertion device forming the second device are cut free from the belt portion by a movable cutting blade which operates against a rigid cutting blade in such a way that the terminal wires are cut off in a defined manner to the final length. The freely cut components are raised by the insertion apparatus from the centring and clamping position, are moved into the position specified on the printed circuit board and are lowered into the corresponding holes in the printed circuit board, the terminal wires which project from the lower side of the printed circuit board preferably being checked for correct positioning in a manner known per se and bent at the same time.

The radial components are introduced laterally into the apparatus from a magazine arrangement by rollers or, folded in a zigzag manner, from boxes. This can be carried out either by a magazine disposed on one side of the apparatus, or from two magazines which are disposed diametrically opposite one another on opposite sides with respect to the longitudinal axis of the apparatus, so that the radially bound components are introduced into the automatic apparatus from both sides in the same positioning. In each case the belt band of the roller is moved forward and a component which is required on the conveyor element on account of the programmed control is separated from the belt band. The radial components are removed from the roller in a timed manner in the running direction of the belt, are cut off individually and are delivered individually to the conveyor element transversely to the running direction of the belt, i.e. are conveyed through the apparatus in the axial direction of the terminal wires. By feeding the components in the axial direction of the radial components or the terminal wires with a following component head and a leading box a very gentle and highly advantageous delivery is made possible, since the adhesion point is the most resistant in the axial direction and any transverse acceleration acting upon the part can cause the adhesive belt to be loosened from the box (belt portion). The individual belt portions with the radial component disposed thereon are conveyed through the apparatus in a timed manner on a preferably ladder-shaped conveyor belt, e.g. a toothed belt. The conveyor belt comprises a free space for receiving the head of the component and the webs of the belt, and the cut-off component belt portions are held centred on the walls of the pierced perforation holes (conveying holes) under pre-tensioning on lugs provided on the conveyor element and are firmly clamped by force fit. The conveying of the cut-off component belt portions on the walls of the perforation holes produces an optimum degree of precision, since the distance of the perforation holes from one another is substantially more exact than for example is the distance of the terminal wires of a component from one another.

In the case of a design as an automatic insertion apparatus, after the introduction of the terminal wires of a component with the insertion pincers into the printed circuit board a compressed air cylinder of a pressing device disposed rigidly above the insertion head moves its ram out which is provided with a rubber cap. This ram presses on the component, and the insertion pincers open and move out of the component. The pressing device then presses the component completely against the printed circuit board, below which bending tools are disposed which bend the terminal wires and which at the same time check whether the terminal wires are present in the required number.

The apparatus is particularly simple in construction, universal in application and not susceptible to poor belt quality, since, on account of the toothed belt conveying in conjunction with the clamping of the component belt portions by the attachments of the transverse webs, an extremely good precision of the conveying is possible and during the entire conveying the components or their terminal wires are not stressed even when being conveyed. In this connection it is not important for the mode of operation of the apparatus even when designed as an automatic insertion apparatus whether components with one, with two, with three, with four or with more terminal wires are to be handled. In addition, during the transfer from the component belt band to the conveying apparatus and also during the transfer from the conveying apparatus into the device for further handling, e.g. insertion pincers, the components are always centred and positioned in an exact manner, so that terminal wires of the components diverging from the normal position can again be oriented without difficulty.

When the apparatus is constructed as an automatic insertion apparatus it is also particularly advantageous that the stumps of the terminal wires, which after insertion into the printed circuit board project downwards from the printed circuit board, need no longer be cut since they can already be cut to the finished length at the transfer station.

A further crucial advantage of the invention is that a rectifying program can be carried out in a particularly simple manner, which ensures a minimum non-productive time of the apparatus, so that any position of the sequence belt can if necessary be utilized again without a very short time.

The invention is described in greater detail below with reference to the Figures of embodiments. In the drawings FIG. 1 is a block diagram of the main design of the apparatus according to the invention;

FIGS. 6 to 8 show a conveying dish of the conveyor element in a longitudinal view, in a cross-section and in a perspective view;

FIG. 11 is a view of an advancing drive for the belts provided in the magazines;

FIG. 12 is a section through a portion of the advancing drive corresponding to line III—III of FIG. 11;

FIGS. 20 to 22 show the transfer of the components from the conveyor element to the insertion head of the automatic insertion apparatus;

FIGS. 23 and 24 are diagrammatic views of the pincers of the insertion head, with the pincer head cut in each case, and in a plan view of the pincer head, with two-armed or three-armed components;

FIG. 25 is a modified embodiment of the insertion head;

FIG. 26 is a plan view of the insertion head;

FIG. 27 is a section along line VI—VI in FIG. 26;

FIG. 28 is a detailed lateral view of the pincers;

FIG. 29 is a plan view of an embodiment of the insertion head adjustment;

FIG. 30 is a lateral view of FIG. 29;

Figure 1:
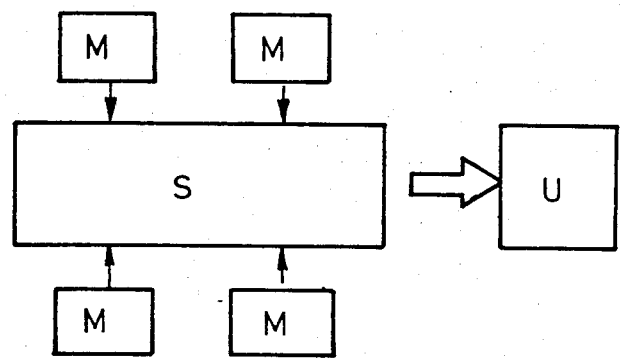

The device according to the invention in shown in outline in FIG. 1. It comprises a device S for sequence formation of the electrical components and a device U for further handling the said components. In the device S the components, which are available there in magazines M on a plurality of belts in a radially bound form, each belt supporting a plurality of components of the same type, are called up in a program-controlled manner and are put into a sequence required for the subsequent equipment of an electrical circuit. The components are transferred to the device U in this sequence at the transfer station of the device S.

EXAMPLE 1

Figure 13:
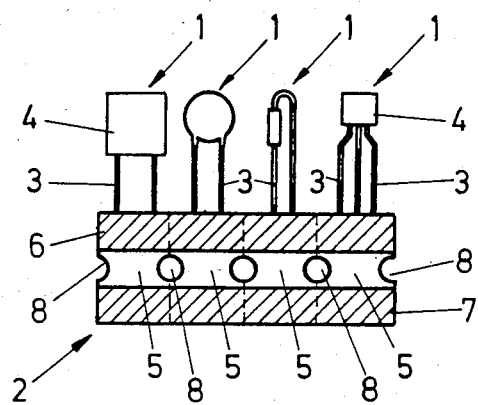
FIG. 13 shows a plurality of electrical components of various types in the bound form.

In the case of the apparatus 9 illustrated in FIGS. 2 to 16 the device U is formed as a device for renewed binding of the components (binding station 60). Accordingly, in this embodiment according to FIG. 13, electrical components 1 of various types are produced, which are held in a radially bound form on a common belt 2, namely in a sequence in which the components 1 are required for the subsequent provision of an electrical circuit (e.g. a printed circuit board) in an automatic insertion apparatus. The terminal wires 3 and the component bodies 4 of the components are oriented in a direction perpendicular to the longitudinal extension of the belt 2 away from the longitudinal side of the said belt. In FIG. 13 the right-hand component is a transistor, the following component is a resistor, the following component is a ceramic capacitor and the left-hand component is an electrolytic capacitor.

The belt 2 is formed by individual belt portions 5, on which a component 1 is held by means of an adhesive strip portion 6 in each case and which are connected to one another by one, but preferably by two continuous adhesive strips 7 provided in each case on the longitudinal sides of the belt 2. The belt 2 comprises perforation holes which are formed in each case on the mutually adjacent edges of the belt portions 5, in such a way that two lateral recesses or hole areas 8 provided on these edges combine to form a perforation hole. The device S for sequence formation will now be described.

Device for sequence formation:

This device comprises a plurality of magazines which are designated 10 and each of which is used to receive a belt 12 which is wound up to form a coil 11 and on which similar components 1 are held in each case in a radially bound form with the aid of the adhesive strip 6 and which comprises perforation holes 8'.

Figure 2:
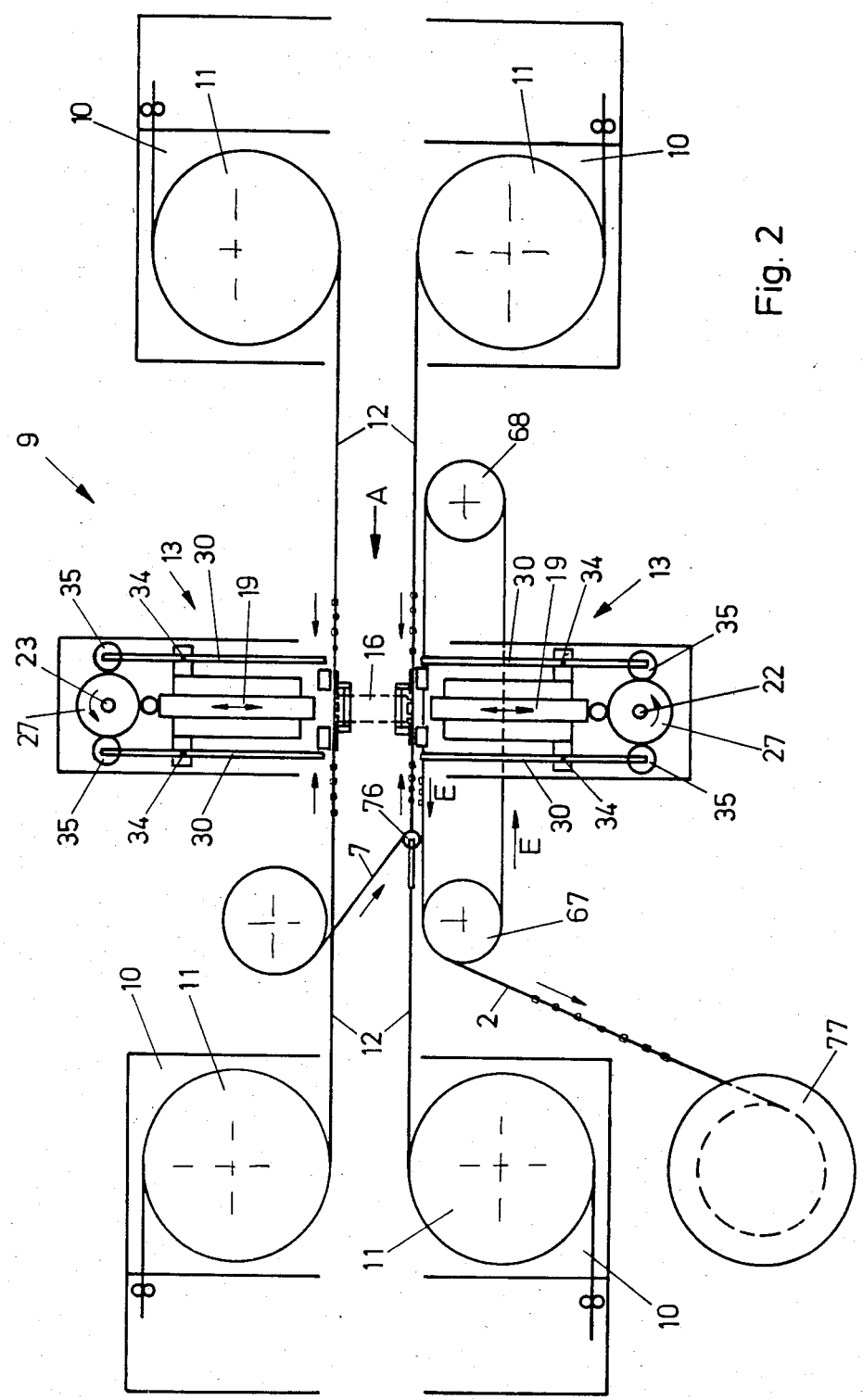
FIG. 2 is a diagrammatic plan view of a first embodiment of the apparatus in the form of a device for binding radially bound electrical components of different types on a common belt in a sequence required for insertion into an electrical printed circuit board.

The magazines 10 are disposed one above the other in the manner of columns in horizontal planes (magazine planes), four magazines 10 being provided in each magazine plane, namely, in the view selected for FIG. 2, two magazines 10 on the left-hand side and two magazines 10 on the right-hand side of a machine frame 13 extending in a vertical direction. In each magazine plane the magazines 10 are arranged on each side of the frame 13 diametrically opposite one another. At the same time the magazines 10 on different sides of the machine frame 13 are also diametrically opposite one another (with respect to the machine frame 13). On account of this diametrically opposite arrangement it is made possible for the insertion and position of the components in the apparatus or machine to be identical.

In the central part of the machine frame 13 two deflector rollers 14 and 15 formed in the manner of a toothed belt are mounted at the upper and at the lower end so as to be rotatable about a horizontal axis in each case, at least one deflector roller, for example the deflector roller 15, being driven in a timed manner by a drive motor not shown in greater detail, e.g. a stepping motor or a direct-current motor with position control. A belt-shaped, continuous first conveyor element 16 is guided over the deflector rollers 14 and 15 and, on account of the arrangement of the deflector rollers 14 and 15, comprises two lengths 16' arranged in the vertical direction and at a distance from one another and, on account of the drive of the deflector roller 15, likewise circulates in a timed manner, normally in a direction corresponding to arrows B.

The conveyor element 16 comprises two toothed belts 17 which are arranged parallel to one another and at a distance from one another and which are connected to one another by way of a plurality of webs 18 (holders) arranged in each case at a uniform distance from one another and orientated with their longitudinal extension at right angles to the direction of movement of the conveyor element 16.

At the side of each vertical length 16' of the conveyor element 16 is provided a long blade or cutter bar 19 which extends in the direction of movement of the conveyor element, i.e. in the embodiment illustrated likewise in the vertical direction, and which is used to cut off individual belt portions 5 (with appertaining component 1) to be transferred to the conveyor element 16 from the belt bands 12 available in the magazines 10, namely in the median axis of the perforation (perforation holes 8'). Each cutter bar 19 is displaceably guided both at its upper and at its lower end in a horizontal guide 20 and 21 respectively in such a way that it can perform a reciprocating movement corresponding to the double arrows C towards the conveyor element 16 and away from it again in a direction at right angles to the axis of the deflector rollers 14 and 15. In order to drive the two cutter bars 19 two vertical main or master shafts 22 and 23 are used, which are rotatably mounted on the machine frame 13 at the upper end at 24 and at the lower end at 25 and which are disposed in each case on the side of the associated cutter bar 19 lying remote from the conveyor element 16. At the upper end the two shafts 22 and 23 are connected in a driving manner by means of a chain or belt drive 26 to one another and to a driving element (motor) which is not shown. In the region of their upper and lower bearing 24 and 25 respectively the shafts 22 and 23 each support a cam or eccentric disc 27, which bears against a roller 28 at the upper or at the lower end of the associated cutter bar 19. On account of the cam discs 27 the cutter bars 19 are reciprocated in the direction of the double arrow C in the manner described above, it being possible for the cutter bar 19 to be restored to its starting position shown in FIG. 3 by means of resilient means (not shown). In principle it is also possible to design the cam discs 27 in such a way that the cutter bars 19 are guided in an automatic manner without resilient means being required for restoration.

Figure 3A:
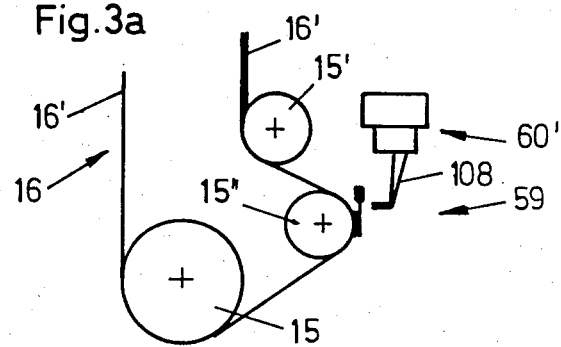
FIGS. 3 and 3a are side views (direction of view corresponding to arrow A) of the apparatus according to FIG. 2 and a detail in a modified embodiment.
Figure 3:
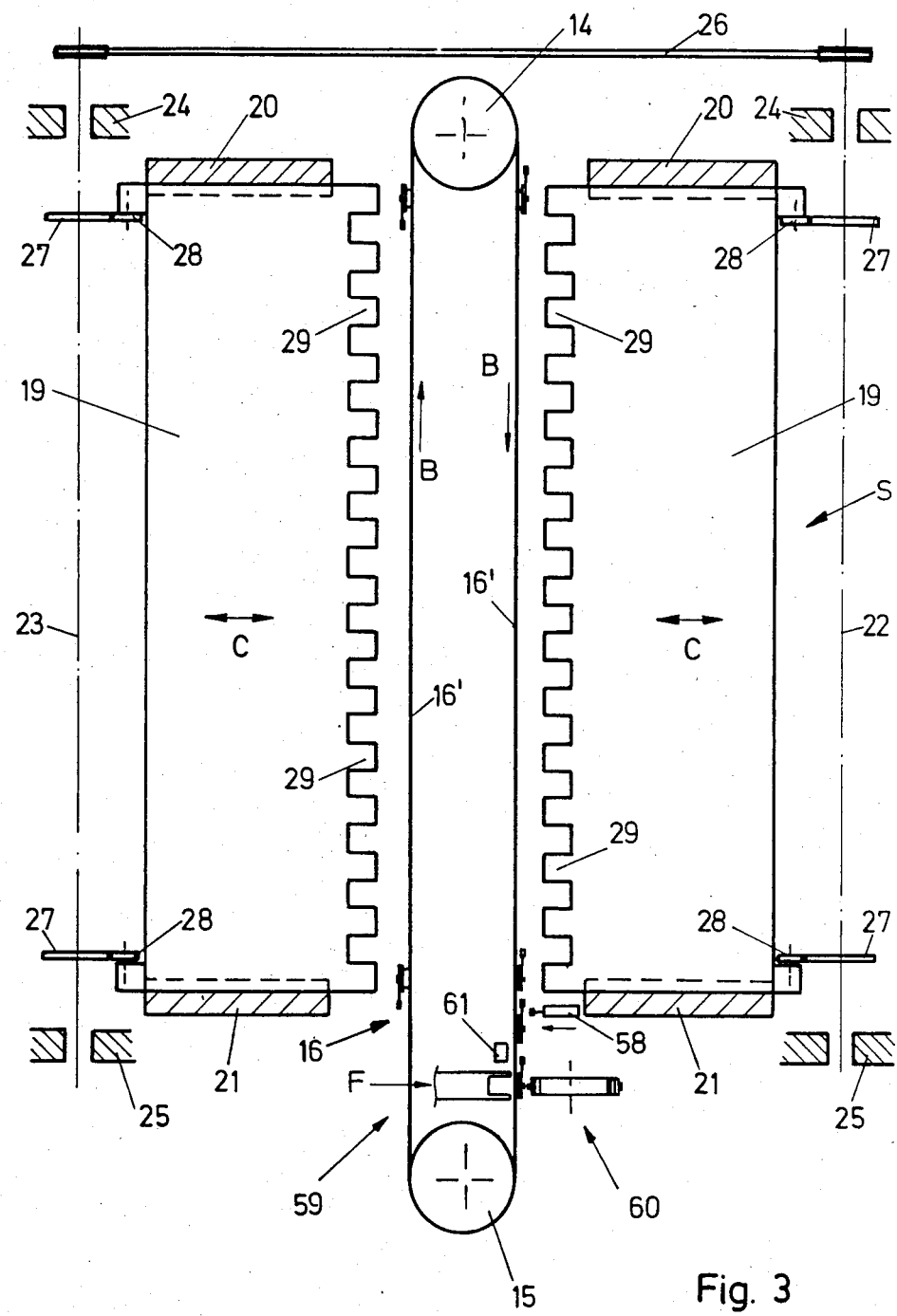
Figure 4:
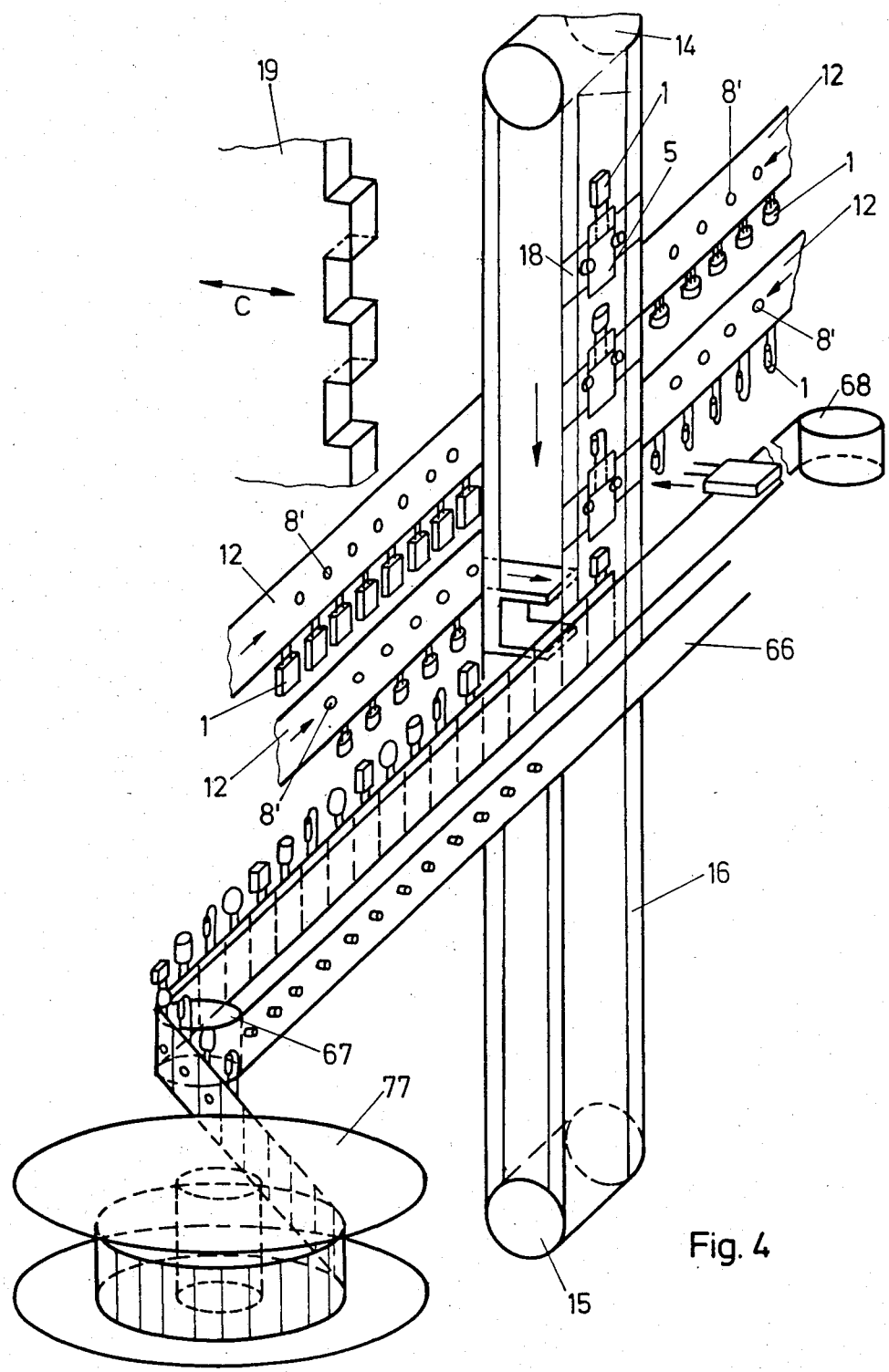
FIG. 4 is a similar view to FIG. 3, but in a perspective view.
Figure 5:
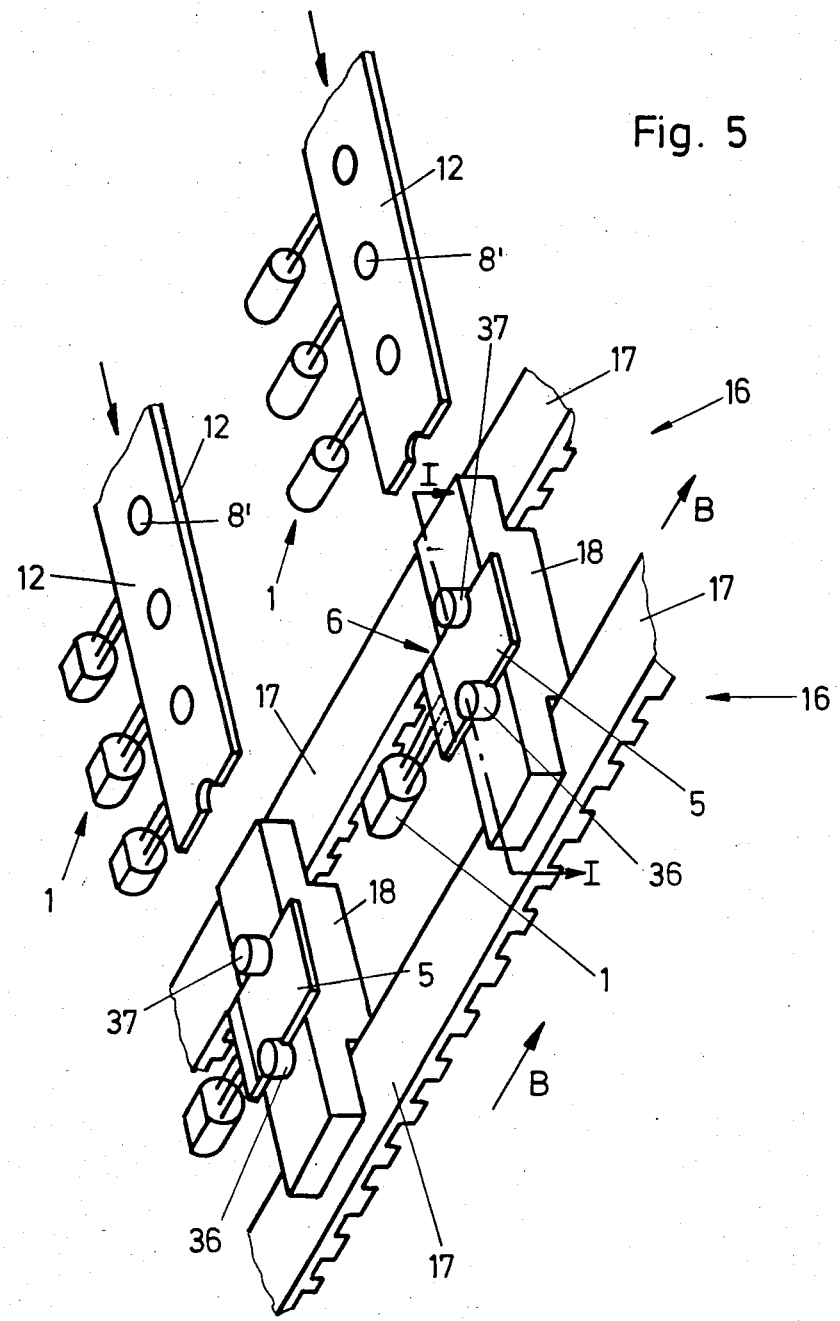
FIG. 5 is a perspective view of a partial elevation of the transfer (loading position) of the electrical components from the individual magazines and their delivery on the first conveyor element.

On their side facing the conveyor element 16 the cutter bars 19 are provided with a plurality of cutting blades 29, two of which in each case are arranged one behind the other in the plane of the drawing of FIG. 3 and form a pair of cutting blades. In addition, they are arranged such that each pair of cutting blades on one cutter bar 19 has opposite it a pair of cutting blades on the other cutter bar 19 at the same level, the pairs of cutting blades which lie opposite one another each lying on the same horizontal level as a plane of the magazine. Each pair of cutting blades defines a loading position of the apparatus.

At the side of the two vertical lengths of the conveyor element 16 and on both sides of each cutter bar 19 two rockers 30 are held on the machine frame 13 so as to be pivotable in each case about an axis extending in the direction of movement of the conveyor element 16, i.e. in the embodiment illustrated about a vertical axis, each rocker 30 extending over the entire length of the cutter bar 19 and supporting at its end facing the conveyor element 16 a plurality of compressed air cylinders 31 in such a way that each compressed air cylinder 31 is oriented in a direction at right angles to the direction of movement of the conveyor element 16 laterally of a cutting blade 29. Each compressed air cylinder 31, which is associated with a magazine 10 in each case and is connected to a compressed-air control device (not shown in greater detail) by way of at least one compressed-air control line 32, comprises a piston which is displaceably guided in the cylinder and the piston rod of which projects beyond one end of the compressed air cylinder 31 and with this projecting end forms a ram or entrainment pin 33 which can engage in a perforation hole 8' in a belt 12 in order to advance the said belt, when the cylinder 31 in question is acted upon with compressed air. Of course, by using two control lines 32 on each compressed air cylinder 31 and by an appropriate design of the said compressed air cylinder the entrainment pin 33 can be controlled by compressed air alone.

In the embodiment illustrated, the rockers 30 can be pivoted about their vertical pivot axis 34 as a result of the fact that with their end remote from the conveyor element 16, or with rollers 35 provided there (in an appropriate design of the cam discs 27), the rockers abut against the said cam discs 27 while being pressed by a restoring spring element (not shown in greater detail). On the other hand, the rollers 35 may cooperate with additional cam discs provided on the shafts 22 and 23. Always when the rockers 30 pivot with their ends facing the conveying element 16 moving towards the cutter bar 19 provided between two rockers, those belt bands 12, having a perforation 8' which the associated entrainment pin 33 has engaged by previous actuation of the associated compression cylinder 31, are simultaneously advanced together with the first available component 1 by the length of a belt portion 5 (one spacing). After this the cutter bars 19 are moved towards the conveyor element 16 and at the same time cut off the respective belt portion 5 with the associated component 1 from all the advanced belts 12 and press the said belt portion againt the conveyor element 16, namely against an available web 18 of the said conveyor element in each case. It is to be understood that the movements of the conveyor element 16, the rockers 30 and the cutter bars 19 are tuned to one another or synchronized with one another in such a way that at least the belt portions 5 are cut off and the said portions are pressed against the conveyor element 16 with the conveyor element 16 stopped in each case. By appropriate control of the compressed air cylinders 31 in accordance with a preset program as a function of the respective position of the conveyor element 16 it is made possible for the various components 1 from the different magazines 10 to be arranged on the conveyor element 16 in the circulation direction of the said conveyor element already in the sequence required for the further handling or subsequent binding.

The webs 18 used for receiving and holding one belt portion 5 in each case are spaced at a distance from one another in the direction of circulation of the conveyor element 16, which distance is determined by the distance between two components 1 arranged one behind the other with the belt portion 5 on the conveyor element 16, but which also corresponds to the distance between two cutting blades 29 in the longitudinal direction of the cutter bar 19 and thus corresponds to the distance by which two adjacent magazine planes each having four magazines are spaced from one another. Each web 18 comprises two cylindrical lugs 36 and 37 which project from the webs 18 at right angles to the conveying direction of the conveyor element 16 and which engage in partial recesses or half perforation holes 8' (hole areas) in the cut off belt portion 5. In this way each belt portion 5 together with the component 1 held thereon is precisely positioned on the respective web 18 and held by force fit. Since the individual belt bands 12 from the magazines 10 are conveyed standing on edge in the horizontal direction to the conveyor element 16 or to the respective loading position (by the rockers 30 and entrainment pins 33 to the compressed air cylinder 31), each component 1 is secured so firmly on the respective web 18 that the terminal wires 3 lie in the conveying direction of the conveyor element 16, preferably in such a way that (with respect to the normal conveying direction of the conveyor element 16) the respective belt portion 5 is secured to the web 18 so as to be leading and the associated component 1 or its component body 4 is secured to be web 18 so as to be trailing. In this connection the body 4 of each component 1 is disposed in a free space between two adjacent webs 18, while the terminal wires 3 are held on the belt portions 5 with the aid of the adhesive strip portion 6. On the side of the conveyor element towards the interior the webs 18 have straps with grooves (sliding blocks 18') which engage in the toothing of the two toothed belts 17 and are thus secured without difficulty in terms of space. The free edge areas 17" are used for engaging in the double toothing of the deflector rollers 14 and 15 and, where appropriate, for guiding the toothed belts 17 by way of deflector rollers 15' and 15" (FIG. 3a).

Figure 9:
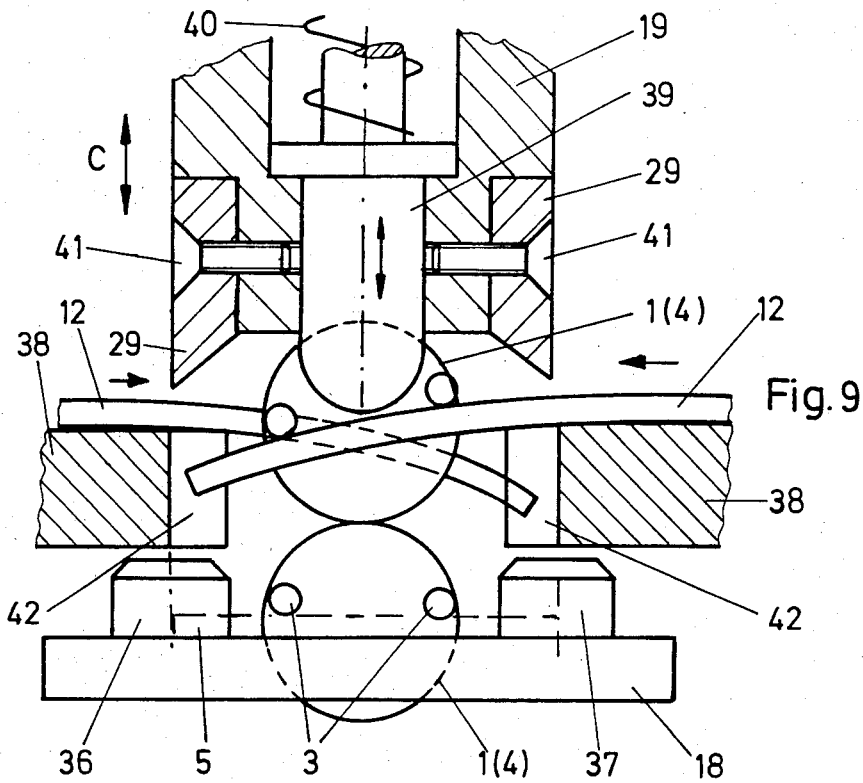
FIG. 9 is a lateral section of a cutting apparatus for cutting off the components held in each case on a belt portion from the belt supporting the said components in each magazine, with the cutter bar in the rest position.
Figure 10:
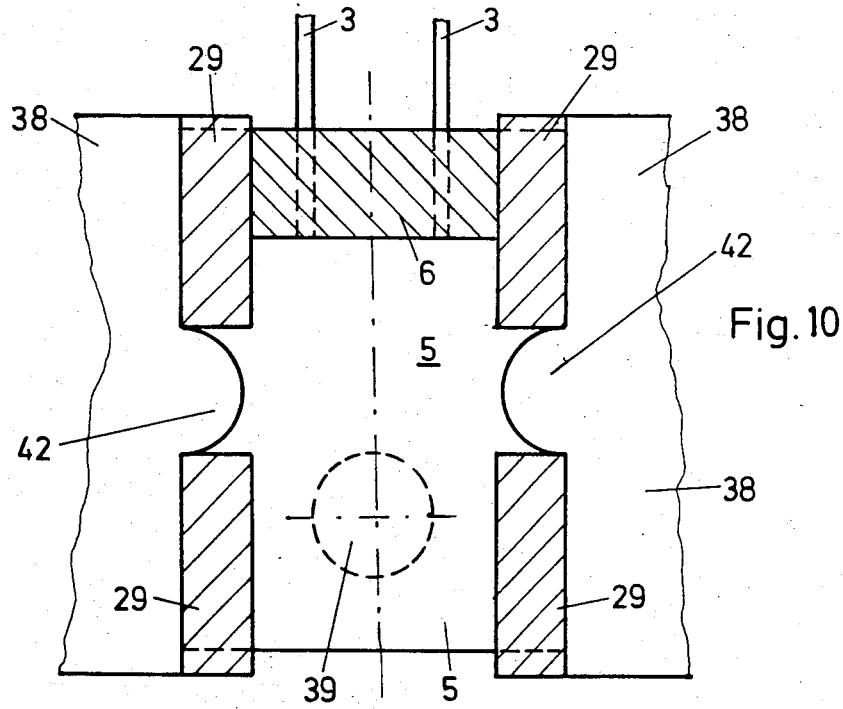
FIG. 10 is a plan view of the cutting apparatus according to FIG. 9.

The design of the cutting apparatus or loading positions comprising the cutter bars 19 is illustrated in detail in FIGS. 9 to 12. The movable cutting blades 29 provided on the cutter bars 19 cooperate with rigid or stationary cutting blades 38. On the cutter bars 19 each pair of cutting blades formed by two cutting blades 29 have associated with them a rounded, resilient holding-down device 39 which presses from the side against the associated belt 12 and bends the free forward end of the said belt slightly to the side, i.e. in the direction of the conveyor element 16 (as shown in FIG. 9), before the cutting operation begins, so that the free end of the belt 12 together with the associated component 1 is guided in the space between the two rigid cutting blades 38 and cannot give way.

The rounded holding-down device 39 is pre-stressed by a spring 40. The movable cutting blades 29 are secured to the blade or cutter bars 19 by means of screws 41. At the conclusion of the cutting procedure each cutter blade 19 executes a further movement towards the conveyor element 16 and thus presses the belt portion 5 cut off from a belt 12 into the position indicated with broken lines in FIG. 9 bearing against the available web 18 for further delivery to the conveyor element 16. Each cutting blade 38 comprises a semicircular projection 42 in its central area. During the cutting procedure and during the transfer of the cut off belt portion 5 these projections 42 lie flush with a lug 36 or 37 in each case, so that not only is the belt 12 engaging on a projection 42 with the foremost partial recess or hole area 8' prevented from slipping during the cutting procedure, but a trouble-free guidance and holding of the cut off belt portion 5 is also made possible during the transfer of the said belt portion to the available web 18.

The design and the function of the rocker 30 with an additional braking or holding device for the ends of the belt portions 12 is shown in greater detail in FIG. 11. As already mentioned above, always when a compressed air cylinder 31 associated with each magazine 10 is actuated, the respective belt 12 of the said magazine is moved forward by one step (length of a belt portion 5) or is moved into the region of the cutting apparatus, when the rockers 30 disposed on both sides of a cutter bar 19 move towards one another or to the cutter bar 19. If a specific compressed air cylinder 31 is not actuated, then despite the pivoting of the rockers 30 the associated belt 12 is not moved forward. Braking devices, which are secured to holding bars 43 and 44 on the machine and which are constructed in the form of brake blocks 45 and 46 with rubber bearings 47 and 48, cooperate with the belt bands 12 and their supports. Respective parts 49 and 50 of the blocks act in each case as a bearing surface for a belt 12 and are produced from wear-resistant material. The numerals 51 and 52 each designate a rigid counter support which is formed for example by part of the rigid blade 38 in each case. Each belt 12 is held by its free end in the gap between a counter support 51 or 52 and a brake block 45 or 46, so that the free ends of the belt bands 12 cannot be lost even if the entrainment pins 33 are not in engagement with the perforation holes 8' of the said belt bands.

The movement of the entrainment pins 33 during the advance of the belt is diagrammatically indicated by 53 and 54.

On the holding bars 43 and 44 are provided photoelectric cells or suitable monitoring elements 55 and 56, which check that the components 1 are present in a proper manner on the respective belt 12 during insertion, i.e. they determine whether the components 1 and their terminal wires 3 are present and correctly positioned. Recesses 57, each of which receives a component 1, are formed inside the braking devices between the parts 49 and 51 or 50 and 52 respectively. The counter supports 51 and 52 each have a projection 51' and 52' respectively which is constructed in the manner of a fork with a slot which is open towards the free end of the projection and in which the entrainment means 33 moves during the advance of the belt 12.

In the normal conveying direction (arrow B) of the conveyor element 16 in front of the transfer station 59 there is rigidly provided on the conveyor element 16 a measuring apparatus 58 which tests all the components held on the conveyor element 16 for their presence, quality, mechanical condition and type, before the said components are conveyed by the conveyor element 16 to a transfer station 59 and from the latter to a binding station 60. At the same time the measuring apparatus 58 also makes it possible to check whether the components 1 on the conveyor element 16 are in fact held in succession in the required sequence.

Figure 15:
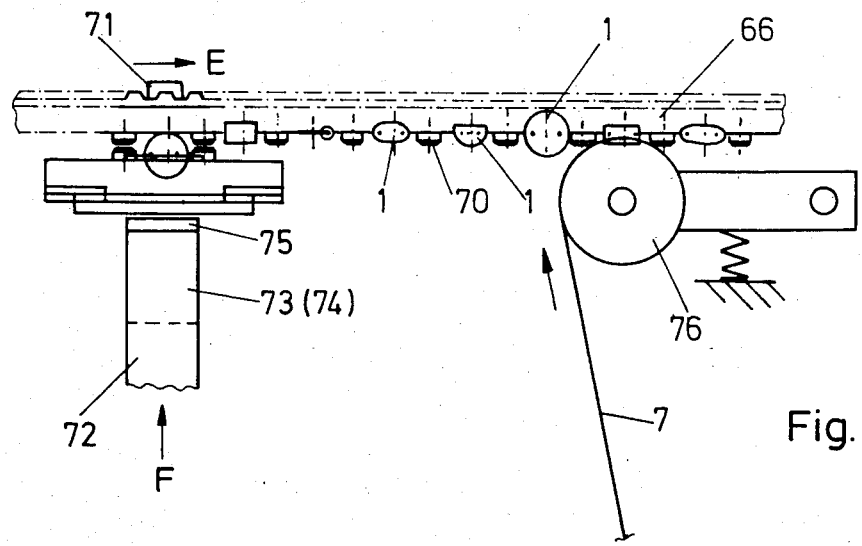
FIG. 15 is a view of the transfer station according to FIG. 14.
Figure 16:
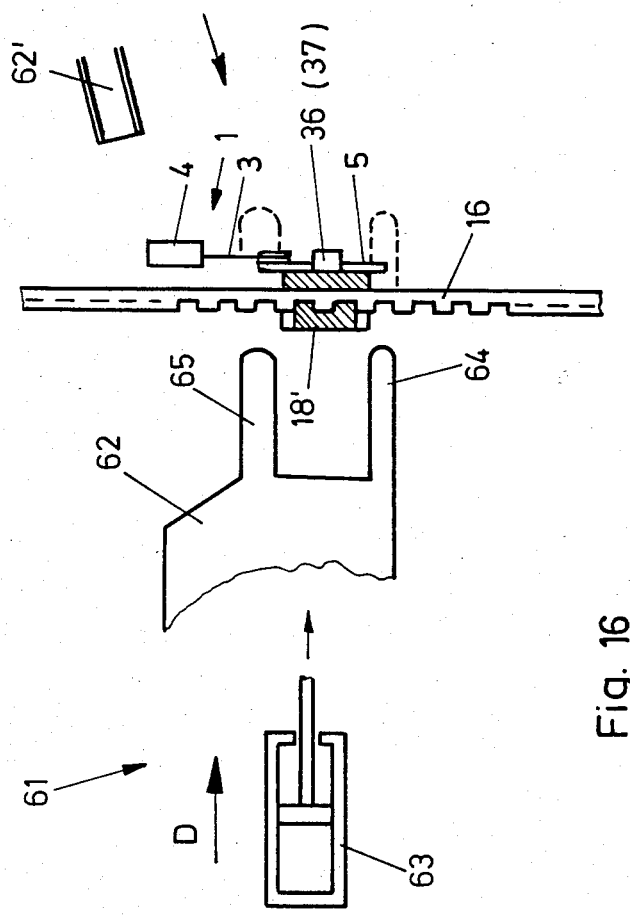
FIG. 16 shows an apparatus for removing defective components from the first conveyor element.
Figure 17:
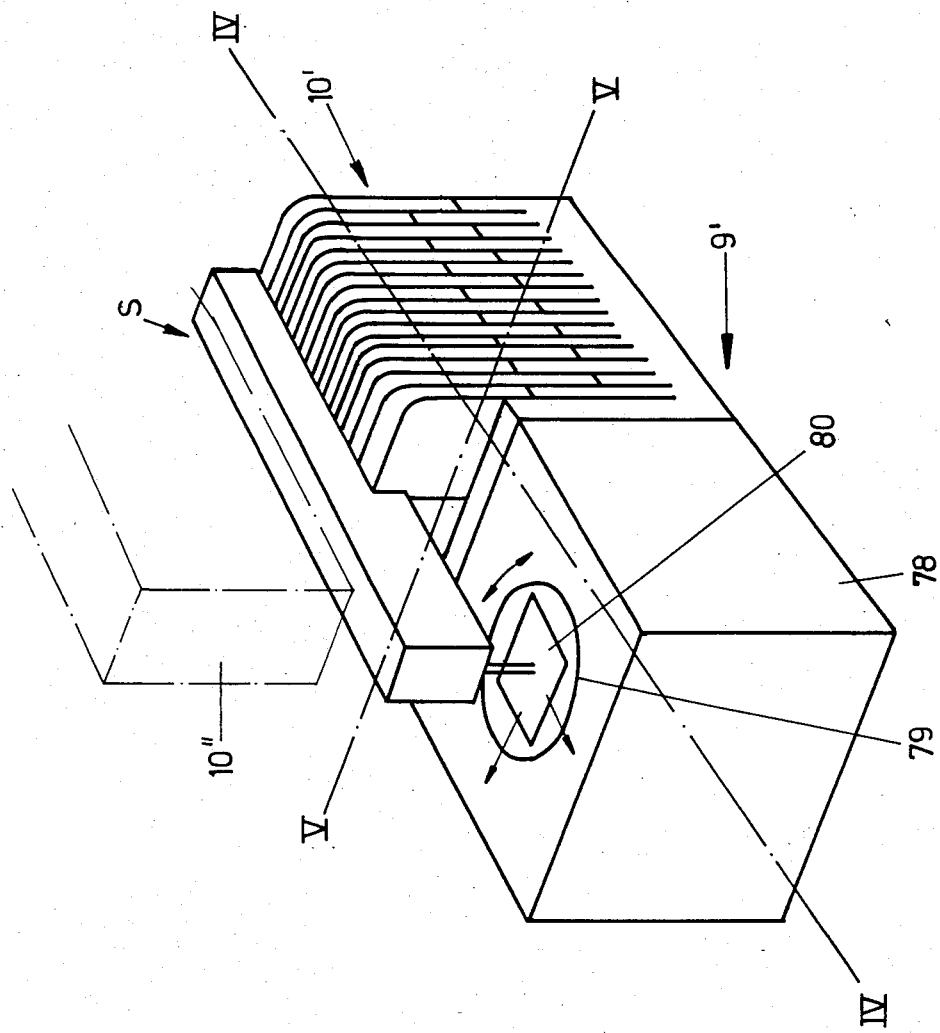
FIG. 17 is a perspective view of a second embodiment in the form of an automatic insertion apparatus.
Figure 18:
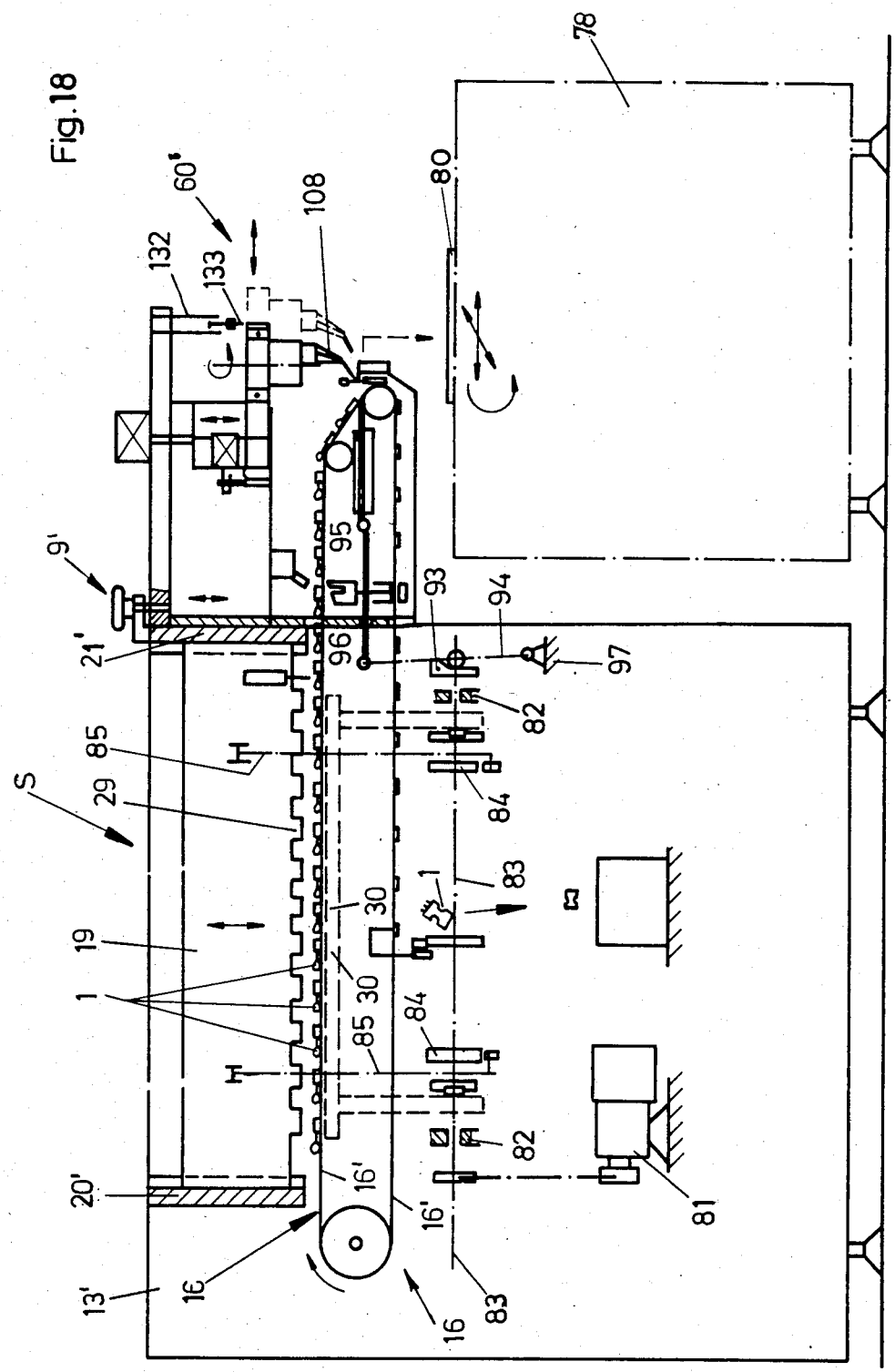
FIG. 18 is a section in the direction of the longitudinal median axis IV—IV of the automatic insertion apparatus.
Figure 19:
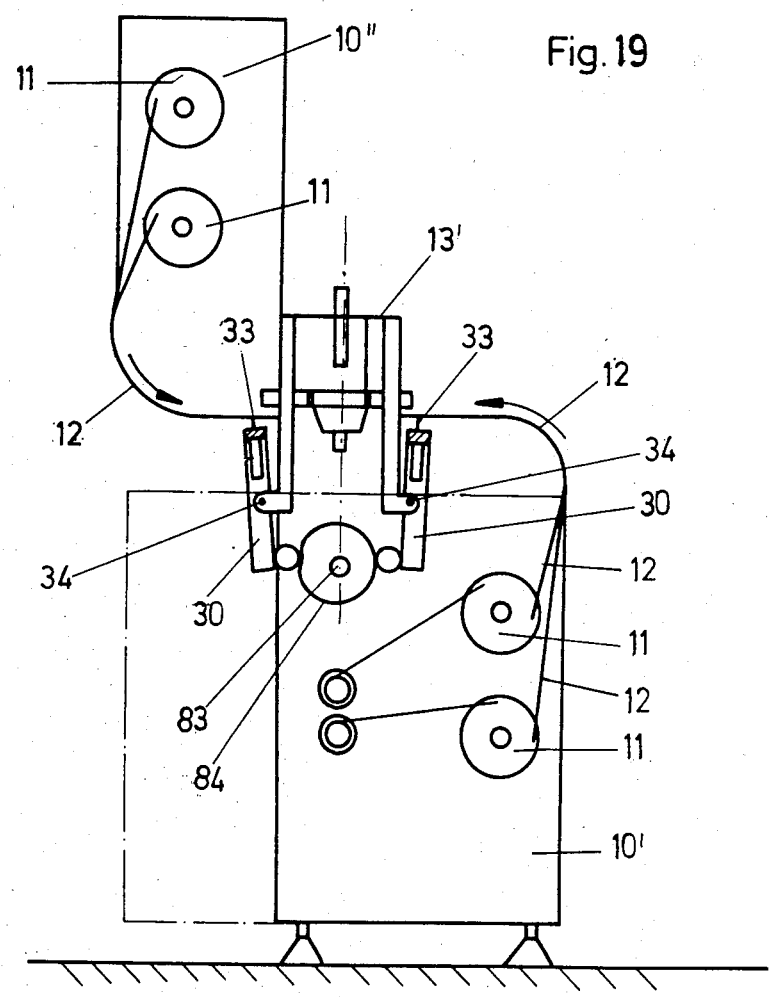
FIG. 19 is a section in the direction of the transverse axis V—V of the automatic insertion apparatus.

If the measuring apparatus 58 finds for example that a specific component is defective or does not correspond to the required type or design, this component is rejected with the aid of a pick-off device 61 which comes after the measuring device 58 in the direction of movement of the conveyor element 16 and is likewise stationary. One embodiment of this pick-off device 61 is illustrated in FIG. 16. In the event of a defective component 1 and/or one not corresponding to the required type or design, a corresponding signal is sent from the measuring device 58 to the pick-off device 61 which removes the defective or incorrect component 1 from the respective web 18 of the conveyor element 16. As shown in FIG. 16, the pick-off device 61 comprises for this purpose an ejector 62, which is displaceable in a horizontal direction (arrow D) and which on account of the signal emitted by the measuring apparatus 58 is actuated by a pneumatic piston 63. At its end facing the conveyor element 16 the ejector 62 comprises two arms 64 and 65 which are arranged at a distance from one another and which, when the cylinder 63 is actuated, engage the web 18 provided with the defective or incorrect component in the manner of a fork and laterally eject the belt portion 5 together with the said component. If the conveyor element extends with its length 16' in the horizontal direction, an air nozzle 62' can be additionally provided for blowing off the defective component 1. After a defective or incorrect component 1 has been ejected, a repair program can be automatically initiated in such a way that after the transfer of the components 1 to the binding station 60 has been interrupted the web 18 previously moved with the incorrect or defective component 1 is moved by forward or reverse movement of the conveyor element 16 to the loading position corresponding to the required component 1 and there it is provided with a new component 1 of the required design and type. Next the conveyor element 16 again occupies the position which it had before the initiation of the rectifying program, so that the transfer of the components to the binding station 60 can be continued. The described device for sequence formation is also used (possibly with minor modifications) in the case of other embodiments to be described below. The device for further handling, which is designed as a binding station in the case of apparatus 9, is described below together with the transfer station 59 with reference to FIGS. 14 and 15.

Binding station:

In the region of the transfer station 59 a further (second) conveyor element 66 is guided directly past the conveyor element 16. This second, likewise band or belt-shaped, continuous conveyor element 66, which is disposed below the two cutter bars 19, runs over two deflector rollers or discs 67 and 68, one of which, for example the deflector roller 68, is driven in a timed manner synchronously with the movement of the conveyor element 16. The conveyor element 66 is likewise formed by a toothed belt, the deflector rollers 67 and 68 then also being toothed belt wheels. The axes of the deflector rollers 67 and 68 are parallel to one another and extend in a vertical direction, so that the conveyor element 66 runs in a timed manner (in the direction of the arrow E) in a horizontal direction, i.e. in a direction which is at right angles to the direction of movement of the conveyor element 16.

The outside of the conveyor element 66 is provided with a plurality of blocks or holding means 69 which comprise lug-like projections 70 on their vertical outer surface. The axes of these projections are at right angles to the direction of movement (arrow E) of the conveyor element 66 and are provided at uniform intervals in the direction of movement (arrow E) of the conveyor element 66 in such a way that the distance between two adjacent lugs 70 is equal to the distance by which the two lugs 36 and 37 are spaced from one another on each web 18. In the case of the embodiment illustrated, each block 69 comprises a single lug 70 in its centre, so that a holding means is formed in each case between the lugs of two adjacent blocks 69. In addition, the arrangement and control of the conveyor element 66 are such that a length of the conveyor element 16 formed between the deflector rollers 67 and 68 is directly opposite the outer surface of the conveyor element 16 below the measuring apparatus 58 and the pick-off device 61 in such a way that in each stoppage phase of the conveyor element 16 the two lugs 36 and 37 of one holding means or one web 18 are directly opposite two adjacent lugs 70. The lugs 70 and the lugs 36 and 37 touch or almost touch at their free ends, while in any case the lugs 36 and 37 of one web 18 are, in effect, continued in two adjacent lugs 70 of the conveyor element 66. The individual blocks 69 are held on the toothed belt forming the conveyor element 66, for example once again with sliding blocks 71 (similar to the sliding blocks 18').

Figure 14:
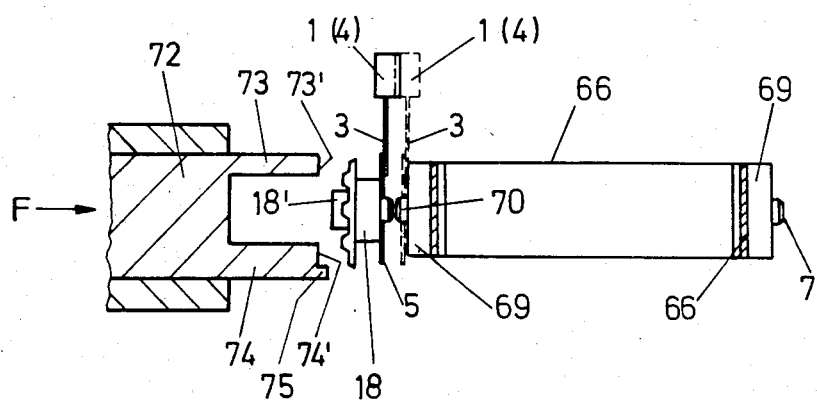
FIG. 14 is a detailed lateral view of a transfer station provided on the device for sequence formation in the apparatus according to FIG. 2, together with a second conveyor element of the device for further handling of the components.

The transfer station 59 essentially comprises an ejector 72 which, similarly to the ejector 62, is disposed on the inside of the conveyor element 16, i.e. on the side of the said conveyor element remote from the lugs 36 and 37 of the webs 18. The ejector 72 can be actuated in the horizontal direction (arrow F) by a driving element (e.g. a pneumatic cylinder) which is not shown in greater detail. At its end facing the conveyor element 16 the ejector 72 comprises two arms 73 and 74 which are disposed one above the other in a vertical plane similarly to the arms 64 and 65 of the ejector 62. The arms 73 and 74 form ejection or abutment surfaces 73' and 74' lying in a common vertical plane, the side of the arm 74 remote from arm 73 comprising on this surface a strip-like projection 75 which projects beyond the surface and which with its upper side forms an additional abutment or support surface for each belt portion 5 to be transferred from the conveyor element 16 to the conveyor element 66. FIGS. 14 and 15 show the ejector 72 in its rest position or retracted position. When a web 18 reaches the transfer station 59, in the stoppage phase of the two conveyor elements 16 and 66 the ejector 72 is moved in the direction of arrow F, as a result of which the two arms 73 and 74 enter the space between the two toothed belts 17 of the conveyor elemet 16 and engage the web from above and below. In this connection the surfaces 73' and 74' come to bear against the belt portion 5 which projects slightly beyond the upper side and underside of the web 18. When the ejector 72 is further displaced in the direction of arrow F the belt portion 5 together with the component 1 held thereon and projecting upwards therefrom is pressed by the lugs 36 and 37 on to two mutually adjacent lugs 70 of the conveyor element 66 which are directly adjacent the said component 1, the projection 75 forming an additional lower support surface for the belt portion 5 in the manner described above. After the belt portion 5 has eventually been pushed onto two adjacent lugs 70 of the conveyor element 66 the belt portion 5 is in turn held there by force fit. After the ejector 72 has returned to its starting position in which the surfaces 73' and 74' lie laterally of the inside of the conveyor element 16, the conveyor elements 16 and 66 perform a further movement step, i.e. the conveyor element 16 moves one stage further which corresponds to the distance between two webs 18, while the conveyor element 66 is moved further by one stage which corresponds to the distance between two lugs 70. After the two conveyor elements have been stopped again, a further belt portion 5 with a further component 1 is transferred to the conveyor element 66 in the manner described above, so that finally belt portions 5 with different components 1 (in accordance with the required sequence) are held juxtaposed in a direct sequence one after the other each with their hole areas on the lugs 70, in such a way that the components 1 project upwards from the conveyor element 66 at right angles to the direction of movement (E) of the said conveyor element 66. The belt portions 5 held on the half perforation holes (hole areas) on the pins 70 and thus oriented on the conveyor element 66 are finally moved past a roller 76 over which the continuous adhesive strip 7 is guided and which at the same time is also used to press the said adhesive strip 7 against the individual belt portions 5.

Of course, instead of a single continuous adhesive strip 7, a plurality of such adhesive strips can also be supplied, in order for example to join the belt portions 5 to one another both on their upper longitudinal edges and on their lower longitudinal edges to form the package 2 in the manner described above. The belt portions 5 joined to one another by the adhesive strip 7 to form the package 2 are then wound up together with the components 1 secured thereto to form a coil 77. In FIG. 3A an insertion head 60' with insertion pincers 108 is shown instead of the binding station 60 on the transfer station 59. In this case the apparatus 9 is an automatic insertion apparatus. In this connection one length 16' of the conveyor 16 is guided obliquely outwards on the transfer station 59 preferably by way of deflector rollers 15' and 15".

A further apparatus 9' in the form of an automatic insertion apparatus is shown in FIGS. 17 to 31, in which the same reference numerals as in FIGS. 1 to 16 are used for those elements which correspond in their function to the elements of apparatus 9.

EXAMPLE II

The apparatus 9' is again provided with the device S for sequence formation, which differs from the corresponding device 9 merely by virtue of the fact that the conveyor element 16 is arranged with its length 16' in the horizontal direction in such a way that the lengths 16' are superposed one above the other. Instead of two cutter bars, in the apparatus 9' only a single cutter bar 19 is used which is arranged over the entire length 16' and which can be moved up and down at both ends in vertical guides 20' and 21' respectively on the machine frame 13'. The apparatus 9' also comprises only two rockers 30 which are pivotable about a horizontal axis.

Along one longitudinal side of the conveyor element 16 the apparatus 9' is provided with magazines 10' in which two coils 11 can be arranged one above the other in each case. A further magazine 10" is provided diametrically opposite the magazine 10' relative to the vertical median axis. The components 1 are separated from the belts 12 in a program-controlled manner as described above and are transferred to the conveyor element 16. In the case of the apparatus 9' the device U for the further handling of the components is an insertion station with an X-Y table 78 which comprises a rotary table 79 to which is secured a printed circuit board 80 to be equipped.

A drive motor 81 (stepping motor or direct-current motor with position control), which is connected in a driving manner to the main or master shaft 83 rotatably mounted in bearings 82 in the interior of the automatic apparatus below the conveyor element 16, is used for driving purposes. Cam discs 84, which correspond to the cam discs 27 and which cooperate with tie rods 85 secured to the cutter bars 19 and drive the cutter bar 19 raised by spring force upwards and downwards in the machine part, are mounted on the shaft 83. Cam discs 84' for the rockers 30 are also mounted on the shaft 83.

FIG. 20 shows the transfer of the individual components 1 to a pair of insertion pincers 108 which represents an essential part of the insertion head 60'. In this particular embodiment the conveyor element 16 comprises deflector rollers 86 and 87 which are arranged relative to one another and are dimensioned in such a way as to produce a portion 88 of the conveyor element 16 which extends obliquely forward and downward, so that a component occupies a vertical position on reaching the foremost position 89 of the deflector roller 87. This component is designated 90 in FIG. 20. A horizontally acting, stationary blade 91 associated with the terminal wires 3 of the component 90 represents a cutting anvil, against the projection 92 of which the terminal wires 3 of the component 90 come to bear on pivoting into the vertical position. The movable blade apparatus 101 acts against the component 90 from the opposite side (relative to the stationary blade 91). The movable blade is moved in such a way that on the basis of a control curve 93 mounted on the main shaft 83 a rod system 94, 95 with a moving joint 96 and a joint fastening 97 on the machine frame acts in a program-controlled manner upon a pressing, centring and cutting apparatus 98 which is connected to the rod member 96 by way of a joint connection 99. This pressing, centring and cutting apparatus 98 is connected to a stationary carrier 100 to which is secured a movable cutting blade 101 and a tensioning and centring component 102 which forms a movable counter pressing means against the stop 92 of the stationary cutting blade 91. The numeral 103 designates a stationary plate which is used to guide the movable blade 101 and the counter pressing means 102. The movable blade 101 is connected to the rod system 96 by way of the bearing block 104 and comprises a pin 105 which is guided in an attachment 106 of the counter pressing means 102 while being acted upon by the spring 107. The counter pressing means 102 is moved together with the movable blade 101 towards the component 90 in the position designated 89; in this connection the counter pressing means leads with respect to the movable blade. In this way the component secured in position 89 is tensioned and centered by the forward edge of the counter pressing means 102 on the terminal wires 3 acting against the stop 92, so that the component 90 occupies a pre-determined position on the transfer position. In this position of the component 90 the insertion pincers 108 move between the terminal wires 3 of the component and tension the terminal wires. After a further forward movement of the movable cutting blade 101 the spring 107 is loaded, as the counter pressing means 102 no longer moves forward, and the movable blade 101 moves relative to the counter pressing means 102 into the cutting position, in which the terminal wires 3 of the component 90 projecting below the stop 92 together with the box portion 5 are cut off from the component 90 approximately 1 mm below the pincers 108. The pincers 108 then carry out an upwards lift of approximately 2 mm.

The insertion pincers 108 comprise an insertion pincer head 109 (FIGS. 23 to 25) which is designed in such a way that it is provided with recesses for the various terminal wires 3 of the component. By way of example, a component 90 with two terminal wires 3 is shown in FIG. 23, while a second component 90 with three terminal wires 3 is shown in FIG. 24. Irrespective of the number of terminal wires of one component the insertion pincer head 109 is designed in such a way that components with one, two, three or four terminal wires can be held in the same way without any resetting. The insertion head 109 has insertion enlargements 115 for easier insertion of the terminal wires 3, by which the terminal wires can be inserted more easily in the groove-shaped indentations 116 in which the wires 3 are tensioned by the counter pressing means 102. The lamelate extend from the holding or tensioning point of the component 90 essentially horizontally and at a distance from the said holding or tensioning point pass into the three separate arms 117, 118 and 119 which are received in an insertion pincer holder 120 and are arranged offset from one another, so that the insertion pincers 108 are given a high degree of stiffness. The arms 117, 118 and 119 are arranged offset from the holding or tensioning plane of the component 90, the arm 117 preferably extending vertically and the arms 118 and 119 being arranged at different angles with respect to the vertical arm 117. On the other hand, the arm 117 can also be arranged inclined at an angle. In the same way the arm 117 and/or the arms 118 and 119 can also pass in stages from the horizontal on the lamellae into an upright portion, as shown in FIG. 28. An appropriate shaping and design of the arms is in no way restricted to the embodiments illustrated. What is crucially important for the bending or the shape of these arms is that in the region above and laterally of the holding and tensioning position there should be a free space which makes it possible to insert components with the insertion pincers 108 in the narrowest possible space in printed circuit boards, without the possibility of adjacent components already present on the printed circuit board being damaged by the insertion.

The arms 117 and 119 are rigidly secured in the insertion pincer holder 120, and the central arm 118 is arranged so as to be movable in the horizontal plane, so as to ensure a clear and trouble-free fastening of the terminal wires 3 in the recesses 116.

The insertion pincer holder 120 is secured in a holding receiver in the form of a rotary head 121, which is rotatable about a vertical axis 122. In order to remove the components 90 from the position 89 following cutting off the terminal wires 3 to their final length the insertion pincer head 109 of the insertion pincers 108 is moved vertically upwards by approximately 2 mm and then horizontally away from the tensioning position and vertically downwards in the direction of the arrows in the manner indicated by arrows 124. During the horizontal movement a rotary movement can also be initiated. During this downwards movement the stumps of the terminal wires 3 of the component 90 which project downward by approximately 1 mm from the insertion pincers 108 are introduced into the holes in the printed circuit board provided for this purpose. Then the insertion pincers open, move out of the component and back into the starting position. During the horizontal movement, the insertion head can, if desired, be rotated.

The insertion pincer holder 120 according to FIGS. 26 and 27 comprises a horizontal pusher 126 which is rigidly secured to the movable arms 118 of the insertion pincers by means of a screw fastening 127. A rigid cover 128 receives the rigid arm 119 and acts as a sliding guide for the pusher 126. As indicated in FIG. 26 with a double arrow, the pusher 126 can be reciprocated in the plane of the terminal wires 3 of the component 90 and during this movement entrains the arm 118. The pusher 126 is subjected to the action of a return spring 129 which is supported on the wall of the insertion pincer holder 120 and is guided in a bore 130. At the end of the pusher 126 opposite the spring 129 a setting screw 131 is provided for the pusher 126. A pressing means for pressing the components 90 into the holes of the printed circuit board 80 is provided on the insertion head 60'. This pressing means is formed by the end of a ram 133 of a compressed air cylinder 132 provided with a rubber cap, the rotary head 121 which supports the insertion pincers 108 being movable in the horizontal direction relative to the ram 133 by a certain amount in order to be able to move the insertion pincers 108 or their head 109 out of engagement with the terminal wires 3 after the components 90 have been inserted in the printed circuit board 80. The numeral 134 designates the housing of the rotary head 121 which comprises an opening 135 which is partially enclosed by the U-shaped insertion pincer holder 120. The rotary head 121 is driven by way of a motor with a gearwheel 137, the toothing of which engages in the toothed rim 138 of the rotary head 121 in a driving manner. With the aid of pins, support lugs or the like in the form of rigid shafts 139 mounted in bushes, the displacement slide 123 is displaceably mounted in a frame-shaped support 140 which comprises a drive motor 141 which drives the transverse slide 123. The support 140 is an integral component of a pusher 142 which executes a movement in the direction of arrow 144 by way of a drive motor 143 and during this movement displaces the rotary head in the direction of the arrow 144. A slide 145, which is driven in the direction of the arrow 147 by a drive motor 146 and which determines the vertical movement of the rotary head 121, is connected to the pusher 142. The drive motors 141, 143 and 146 thus produce a longitudinal movement, a lateral movement and a vertical movement of the rotary head 121.

FIGS. 29 and 30 are a diagrammatic plan view and a lateral view of the pincer displacement with drives. The numeral 141 designates the drive motor for displacing the centre offset of the insertion pincer holder 120 in the direction indicated by arrow 141. The numeral 143 designates the drive motor for the horizontal reciprocal movement of the insertion pincers in the direction of the arrow 144 over the reciprocated slide 142, and 146 designates the drive motor for the vertical displacement of the insertion pincers 108 in the direction of arrow 147 over the vertical slide 145 which is connected to the slide 142.

Figure 31:
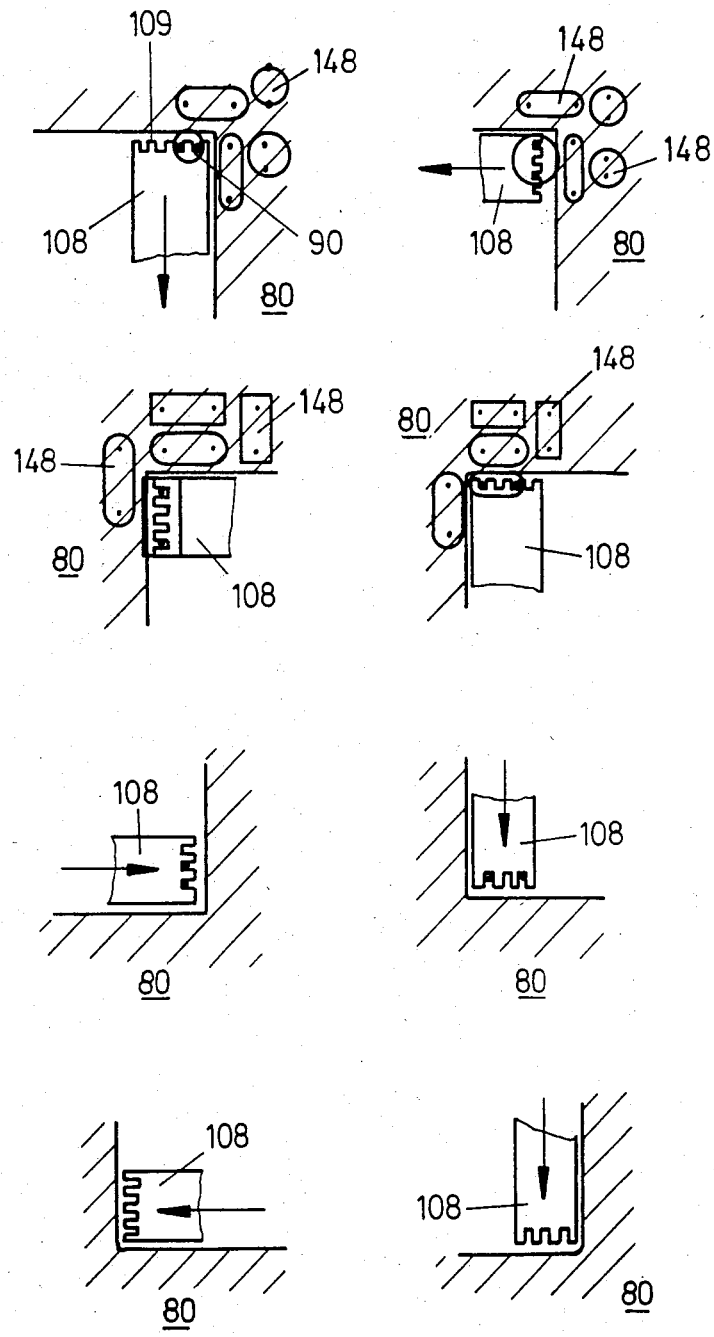
FIG. 31 show examples for providing a printed circuit board or its corner points with components.

FIG. 31 shows, with reference to various possibilities of application, how insertion can be carried out with the insertion pincers 108 in practically any corner of the printed circuit board 80, so that no loss of space on the printed circuit board need occur during insertion. The insertion pincers 108 with the insertion pincer head 109 is indicated diagrammatically. The terminal wires 3 of the components 90 to be inserted in the printed circuit board are likewise illustrated diagrammatically in the insertion position. On account of the fact that the insertion pincers can pivot about 360° in the axis of the printed circuit board, or the insertion axis, the different components provided with different terminal wires 3 can be inserted in the printed circuit board 80 from the side needing the least space-requirement. In this connection the numeral 148 designates components which are already inserted in the printed circuit board 80 and from which the component 90 should be at as small a distance as possible, so that the packing density on the printed circuit board 80 is at a maximum.

On account of the universal mobility of the insertion pincers 108, namely an X-Y movement in the horizontal plane, a pivoting movement in the horizontal plane and a vertical movement, it is possible, during insertion, to achieve the absolute minimum lateral distance from adjacent components, and thus to attain a maximum packing density.

EXAMPLE III

Figure 32:
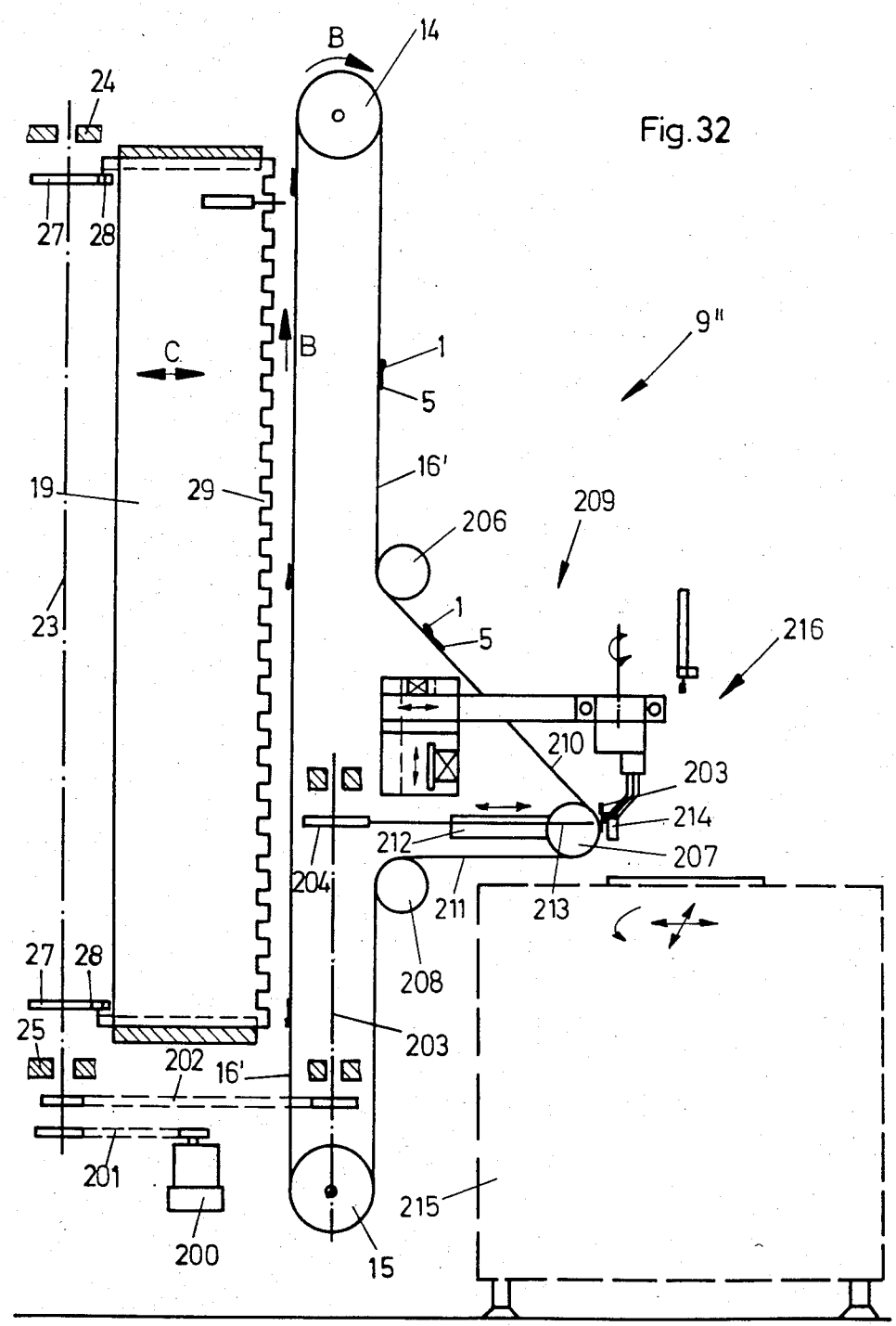
FIG. 32 is a lateral view of a third embodiment in the form of an automatic insertion apparatus.
Figure 33:
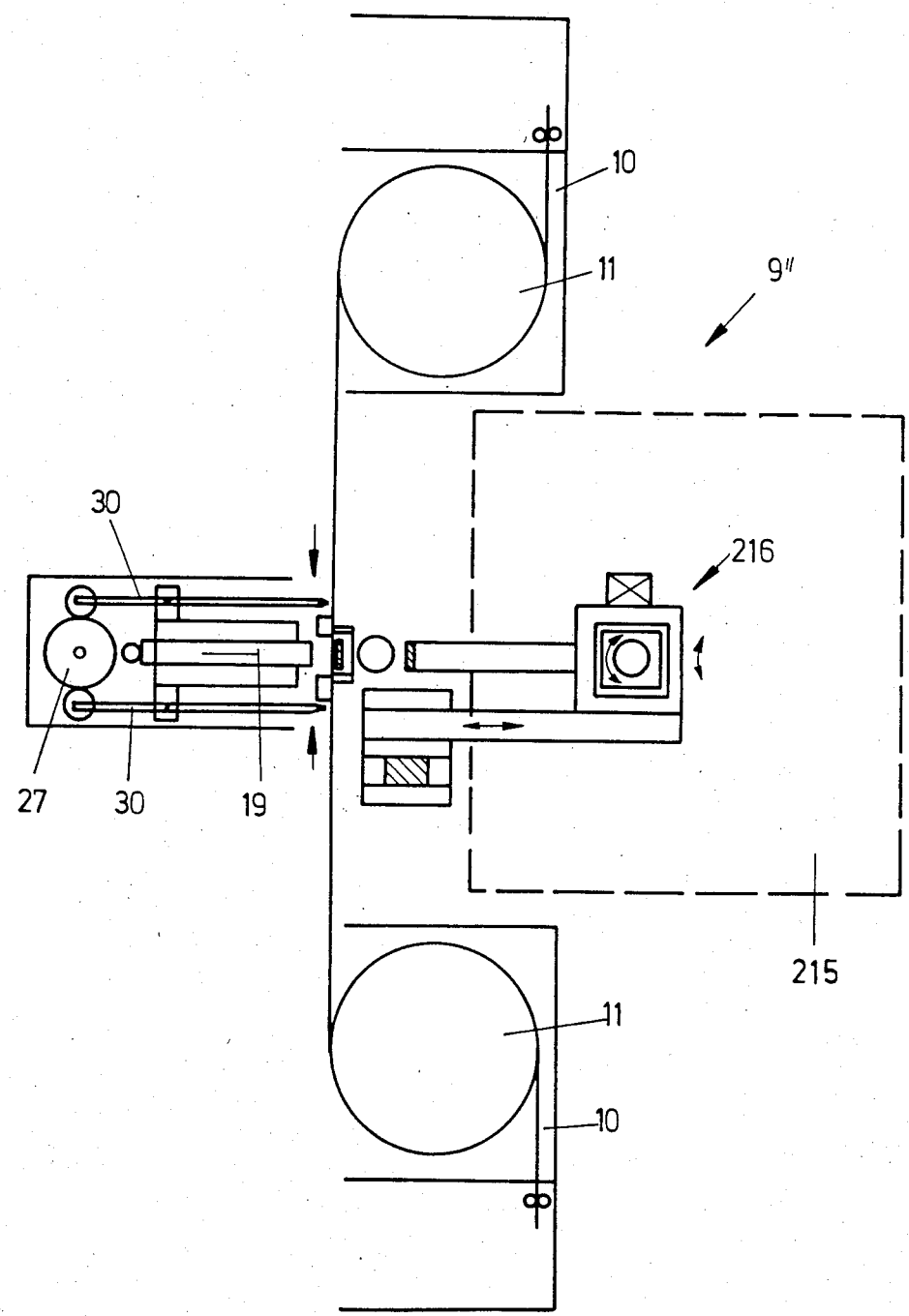
FIG. 33 is a plan view of the automatic insertion apparatus according to FIG. 32.

FIG. 32 is a lateral view of a further apparatus 9″ in the form of an automatic insertion apparatus, in which the device for sequence formation is designed as in the case of apparatus 9 in FIGS. 1 to 16, and in particular the conveying element 16 with its length 16' is disposed vertically. Apparatus 9″ differs from apparatus 9 with respect to the device for sequence formation merely by virtue of the fact that in this case only one cutter bar 19 is provided. A drive motor 200 is connected to the shaft 23 by way of a chain or belt drive 201. A shaft 203, which supports at least one cam or control disc 204 corresponding in its position to the cam 93 of the apparatus 9' for driving the blade arrangement provided on the insertion head 60', is connected in a driving manner to the shaft 23 by way of a further chain or belt drive 202. One length 16' of the conveyor element 16 is deflected over deflector rollers 206, 207 and 208 in such a way that a conveyor element portion 209 is produced which comprises a partial length 210 extending obliquely downwards and a horizontal partial length 211 adjoining the latter. The components 1 stand on the deflector roller 207 in the vertical position, and, in this connection, the tensioning, centring and cutting off of the components 1 and positioning the insertion pincers relative to the printed circuit board are carried out similarly to the illustration according to FIG. 20, as has already been described in the case of the apparatus 9' (FIGS. 17 to 31). Purely for the sake of clarity, moveable cutting blades 212, counter pressing means 213 and a rigid cutting blade 214 of the cutting apparatus for separating the components 1 from the belt portions 5 during the transfer to the insertion pincers are shown, and likewise also the X-Y table 215 and the insertion head 216 which completely corresponds to the insertion head 60' of the apparatus 9'.

I claim:

1. An apparatus for the automatic handling of electrical components of different types, each component having a component body and a plurality of lead wires extending parallel to each other to one side of said body, the apparatus comprising a first device for sequence formation in which said components are arranged in a predetermined sequence, which device includes
   a plurality of magazines each having a supply belt which supports a supply of one of said types of components in radially taped form and which has perforation holes disposed between adjacent components supported thereon,
   means for calling up components from the respective magazines in a program-controlled manner to corresponding loading positions,
   intermittently driven conveyor means for receiving the called-up components in accordance with said sequence and for conveying the received components to a transfer position at which the received components are transferred to a second device for further handling of those components, cutting means at each loading position for cutting off the component at that loading position from the associated supply belt by cutting the associated belt transversely to the longitudinal direction thereof and through the center of the perforation hole between the component at that loading position and the following component supported on the same belt, whereby the cut-off component is supported by a corresponding cut-off belt piece, and means at each loading position for transferring the cut-off component to a receiving portion of said conveyor means, said receiving portion having securing elements positioned in such a manner as to engage perforation hole areas in the belt piece on either side of the cut-off component and thereby secure the cut-off component by said hole areas to the receiving portion, the apparatus being characterized in that the conveying direction of the cut-off components received on the conveyor means is in the axial direction of the lead wires of such received components and, in the area of each loading position, substantially in the plane of and transverse to the supply belt of the component called up to that position, and in that each cut-off belt piece is secured on the conveyor means in such an orientation that the cut-off belt piece is leading with the component body supported thereby trailing in the conveying direction.

2. An apparatus according to claim 1, characterized in that the conveyor means includes an endless band-like element.

3. An apparatus according to claim 2, characterized in that the conveyor means is constructed in the form of a ladder and comprises two continuous band-shaped elements which are disposed parallel to one another and at a distance from one another and which are connected together by webs oriented transversely to the conveying direction of the conveyor means, at least part of said webs comprising said securing elements for the cut-off belt pieces, and in that respective free spaces are formed between successive webs in the conveying direction for receiving the bodies of cut-off components.

4. An apparatus according to claim 2, characterized in that said band-shaped elements are toothed belts.

5. An apparatus according to claim 1, characterized in that said securing elements of each receiving portion comprise a pair of lugs.

6. An apparatus according to claim 5, characterized in that said second device includes retaping means for retaping the components received on said conveyor means in said predetermined sequence, said retaping means comprising further conveyor means having receiving means with lugs for holding and fixing the cut-off belt pieces on their respective hole areas, in that the conveying direction of the further conveying means extends at least at the transfer station at right angles to the conveying direction of the conveyor means of the first device, and in that the further conveyor means is driven in time and synchronously with the conveyor means of the first device in such a way that during any stoppage of the conveyor means of the first and second devices, each of the two lugs of one of the receiving portions of the conveyor means of the first device is directly opposite a respective lug of the receiving means of the conveyor means of the second device, and in that the cut-off belt pieces supporting successive cut-off components received on the further conveyor means are held bearing directly against one another along edges where the same were cut by said cutting means.

7. An apparatus according to claim 6, characterized in that said further conveyor means includes a toothed belt.

8. An apparatus according to claim 1, characterized in that in order to perform a cutting operation common to a plurality of loading positions, said cutting means includes at least one movable cutter bar which extends in the conveying direction of the conveyor means and which performs a cutting movement relative to at least one rigid cutting blade in a program-controlled manner according to the timing of the calling up of components to the loading positions.

9. An apparatus according to claim 8, characterized in that a tape brake is provided at each loading position.

10. An apparatus according to claim 8, characterized in that said calling up means includes means for supplying said belts to the loading positions, in that said supplying means includes a rocker arrangement having at least one rocker, in that said at least one rocker is operated in accordance with the programmed call up of components to said loading positions and comprises a plurality of pressure operated cylinders, each provided for an associated supply belt and having a ram which upon actuation of the associated cylinder engages in one of the perforation holes of the associated belt, said rocker being adapted to advance each respective belt engaged thereby stepwise in increments corresponding to the spacing between perforation holes between successive components on that belt.

11. An apparatus according to claim 10, characterized in that the rocker arrangement comprises two rockers disposed mirror-symmetrically to said cutter bar.

12. An apparatus according to claim 1, characterized in that a measuring device and a wiping device are provided on the conveyor means following a last loading position in the conveying direction of the conveyor means.

13. An apparatus according to claim 1, characterized in that said second device comprises an insertion head for an electrical circuit, said insertion head having pincer-like insertion means secured to a holder which is displaceable at least in a direction at right angles to the plane of the lead wires of a component located at said transfer position, and in that the conveyor means has a portion which extends obliquely forwards and downwards and which is formed by deflector rollers, a foremost end of which portion forms said transfer position at which a received component is taken off said conveyor means by the insertion means.

14. An apparatus according to claim 13, characterized in that said transfer position is located at a transfer station which includes a stationary blade having a fixed stop which bears against the lead wires of the component positioned in the transfer position, and lead tensioning and centering apparatus having counter pressing means for orienting and tensioning the lead wires of that component in the vertical plane, and having a movable cutting blade, the movable cutting blade and the stop of the stationary cutting blade being positioned relative to the component in the transfer position in such a way that the blades may cut the lead wires of that component between the belt piece supporting that component and the body of that component to a precisely defined final length required for the equipment of a printed circuit board.

15. An apparatus according to claim 14, characterized in that the insertion means comprises insertion pincers having a pincer head engageable with the lead wires of the component in the transfer position and formed in such a way that a free space is produced for receiving the body of that component, and means for driving the insertion pincers to remove that component from the transfer position after the end of the cutting operation by said blades and after release of that component by the tensioning and centering apparatus.

16. An apparatus according to claim 15, characterized in that the insertion pincers comprise a plurality of arms which are formed at the insertion pincer head as plate-like elements superposed upon one another and provided with receiving means for receiving the lead wires of the component at the transfer position, an arm facing that component being shaped in such a way as to provide said free space for the component body, and the other arms being inclined with respect to the first-mentioned arm.

17. An apparatus according to claim 16, characterized in that the receiving means of the insertion pincers comprise slot-shaped recesses which are open toward a front end of the plate-like elements and which when the insertion pincers are open are superposed one flush above the other to form an extended inlet.

18. An apparatus according to claim 16, characterized in that a central arm of the insertion pincers is displaceable in the horizontal direction and at right angles to the plane of the lead wires of the component at the transfer position in order to narrow said inlet and thereby firmly clamp the lead wires of that component.

19. An apparatus according to claim 18, characterized in that a horizontally movable pusher, which is securely connected to said central arm and displaceable against a return spring by a compression cylinder, is provided on a holder to which said plurality of arms is attached.

* * * * *